United States Patent
Fujiwara

(10) Patent No.: US 10,296,696 B2
(45) Date of Patent: May 21, 2019

(54) SEMICONDUCTOR DESIGN ASSISTING DEVICE AND SEMICONDUCTOR DESIGN ASSISTING METHOD

(71) Applicant: FUJITSU LIMITED, Kawasaki-shi, Kanagawa (JP)

(72) Inventor: Mitsuyoshi Fujiwara, Kiyose (JP)

(73) Assignee: FUJITSU LIMITED, Kawasaki (JP)

( * ) Notice: Subject to any disclaimer, the term of this patent is extended or adjusted under 35 U.S.C. 154(b) by 9 days.

(21) Appl. No.: 15/296,092

(22) Filed: Oct. 18, 2016

(65) Prior Publication Data

US 2017/0185711 A1    Jun. 29, 2017

(30) Foreign Application Priority Data

Dec. 28, 2015   (JP) ................... 2015-256638

(51) Int. Cl.
*G06F 17/50*   (2006.01)
(52) U.S. Cl.
CPC ...... *G06F 17/5077* (2013.01); *G06F 17/5081* (2013.01)
(58) Field of Classification Search
USPC ....................................................... 716/126
See application file for complete search history.

(56) References Cited

U.S. PATENT DOCUMENTS

2008/0163150 A1 *   7/2008   White ................ G06F 17/5072
                                                 716/52
2016/0110490 A1 *   4/2016   Ding ................. G06F 17/5077
                                                 716/126

FOREIGN PATENT DOCUMENTS

JP    2-133879       5/1990
JP    2000-243838    9/2000

* cited by examiner

*Primary Examiner* — Eric D Lee
(74) *Attorney, Agent, or Firm* — Fujitsu Patent Center

(57) ABSTRACT

A memory stores layout data of a semiconductor circuit. A processor searches for a plurality of wiring routes on the basis of a plurality of cost calculating formulas that respectively represent a plurality of design rules, and on the basis of the layout data, wherein the plurality of wiring routes are a plurality of candidates for a wiring route that corresponds to a processing target net that is connection information that needs to be changed in the semiconductor circuit, and respectively satisfy the plurality of design rules. Then, the processor generates display information that displays the plurality of wiring routes obtained by the search.

12 Claims, 36 Drawing Sheets

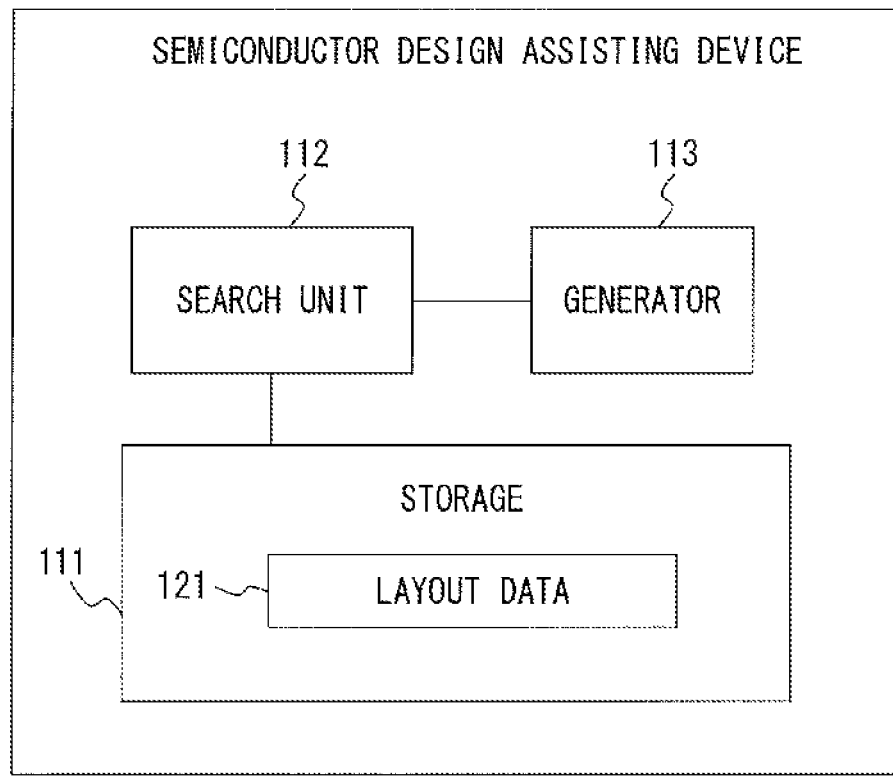
F I G. 1

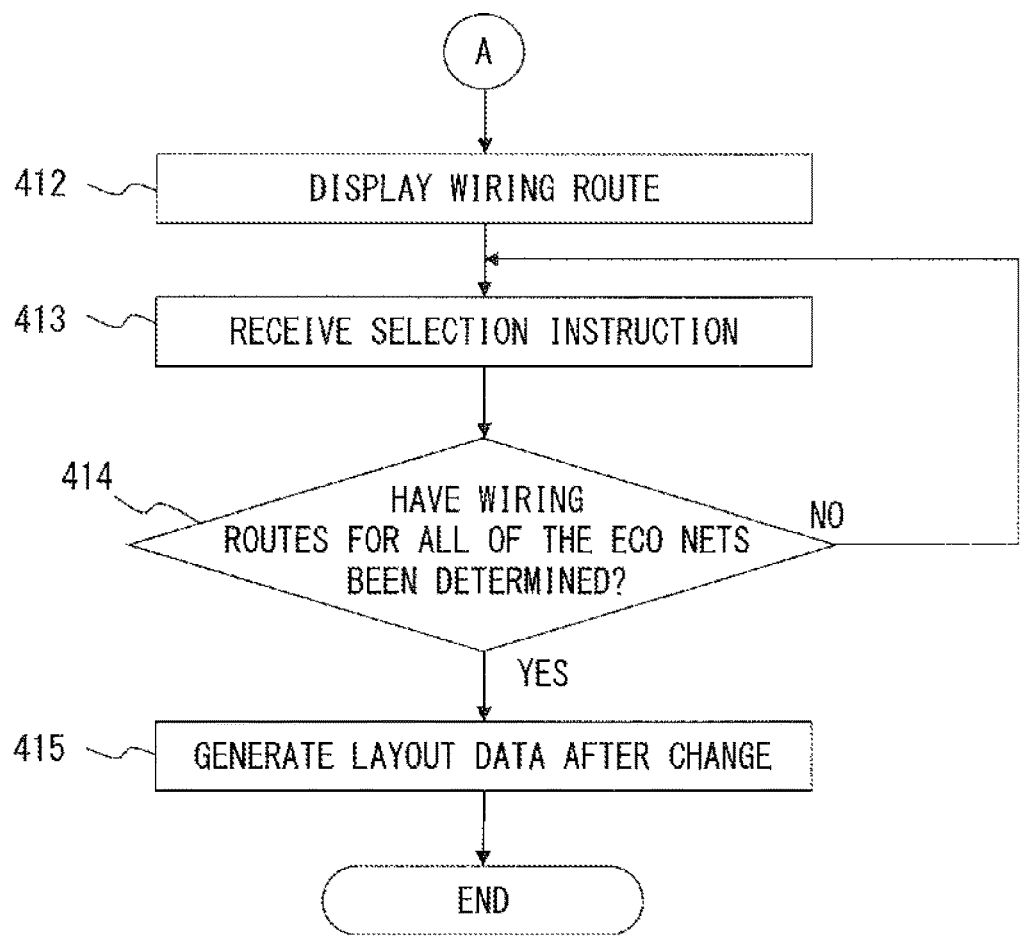
F I G. 4 B

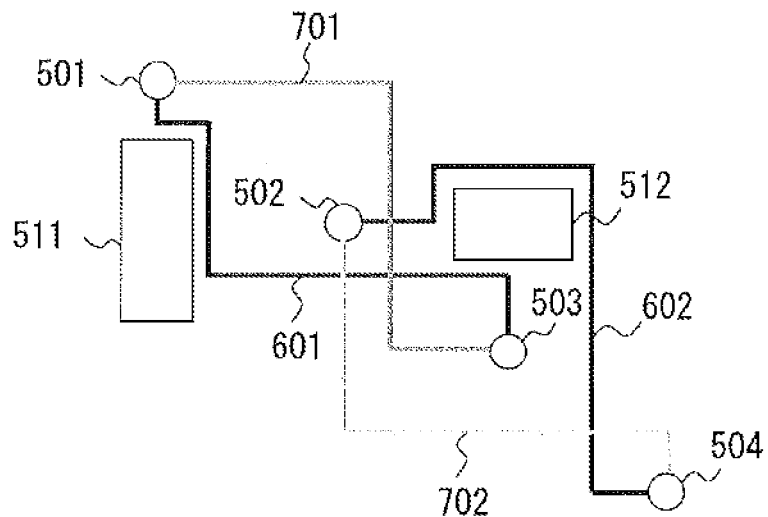
F I G. 7

```
wire eco_net1;
wire eco_net2;
cellA instA (.A(in), .X(eco_net1));
cellB instB (.A(eco_net1), .X(out1));
cellC instC (.A(eco_net1), .X(out2));
cellD instD (.A(in), .X(eco_net2));
cellE instE (.A(eco_net2), .X(out3));
```

FIG. 10

```
wire eco_net1_cost1;
wire eco_net1_cost2;
wire eco_net1_cost3;
wire eco_net2_cost1;
wire eco_net2_cost3;
cellA instA_cost1 (.A(in), .X(eco_net1_cost1));
cellB instB_cost1 (.A(eco_net1_cost1), .X(out1));
cellC instC_cost1 (.A(eco_net1_cost1), .X(out2));
cellA instA_cost2 (.A(in), .X(eco_net1_cost2));
cellB instB_cost2 (.A(eco_net1_cost2), .X(out1));
cellC instC_cost2 (.A(eco_net1_cost2), .X(out2));
cellA instA_cost3 (.A(in), .X(eco_net1_cost3));
cellB instB_cost3 (.A(eco_net1_cost3), .X(out1));
cellC instC_cost3 (.A(eco_net1_cost3), .X(out2));
cellD instD_cost1 (.A(in), .X(eco_net2_cost1));
cellE instE_cost1 (.A(eco_net2_cost1), .X(out3));
cellD instD_cost3 (.A(in), .X(eco_net2_cost3));
cellE instE_cost3 (.A(eco_net2_cost3), .X(out3));
```

F I G. 1 1

```
- eco_net1_cost1 ( instA_cost1 X ) ( instB_cost1 A ) ( instC_cost1 A )
+ ROUTED M3 ( 87300 41940 ) ( 87930 * )
...
- eco_net1_cost2 ( instA_cost2 X ) ( instB_cost2 A ) ( instC_cost2 A )
+ ROUTED M3 ( 87930 41310 ) ( * 41940 )
...
- eco_net1_cost3 ( instA_cost3 X ) ( instB_cost3 A ) ( instC_cost3 A )
+ ROUTED M4 ( 87930 41310 ) ( 88290 * )
...
- eco_net2_cost1 ( instD_cost1 X ) ( instE_cost1 A )
+ ROUTED M3 ( 87500 41950 ) ( 86930 * )
...
- eco_net2_cost3 ( instD_cost3 X ) ( instE_cost3 A )
+ ROUTED M4 ( 87300 42040 ) ( 85930 * )
...
```

FIG. 12

```
eco_net1_cost1 cost1 pattern1
eco_net1_cost2 cost2 pattern2
eco_net1_cost3 cost3 pattern3
eco_net2_cost1 cost1 pattern8
eco_net2_cost3 cost3 pattern9
...
```

F I G. 1 4

```
default polynomial: M = aPL+bDMV+cDM+dLC+eNP+fNM+gBL
default coefficient: a=1,b=1,c=1,d=1,e=1,f=1,g=1
default constant: PL=7,DMV=6,DM=5,LC=4,NP=3,NM=2,BL=1
```

FIG. 15

FIG. 16A netname : neta
layer define : CL = CAD_LAYER
polynomial : M = aPL+gBL+hCL
coefficient : a=1,g=0.1,h=0.9
constant : PL=7,BL=1,CL=1
pattern : pattern1
cost : cost1

FIG. 16B netname : neta
pattern : pattern2
cost : cost2
color : red 320-1:
```
netname:eco_net1
polynomial:M = aPL+bDMV+cDM+dLC+eNP+fNM+gBL
coefficient:a=8,b=7,c=1,d=1,e=1,f=1,g=1
constant:PL=7,DMV=6,DM=1,LC=1,NP=1,NM=1,BL=1
pattern:pattern1
cost:cost1
```

320-2:
```
netname:eco_net1
polynomial:M = aPL+bDMV+cDM+dLC+eNP+fNM+gBL
coefficient:a=1,b=7,c=6,d=1,e=1,f=1,g=1
constant:PL=1,DMV=7,DM=6,LC=1,NP=1,NM=1,BL=1
pattern:pattern2
cost:cost2
```

320-3:
```
netname:eco_net1
polynomial:M = aPL+bDMV+cDM+dLC+eNP+fNM+gBL
coefficient:a=1,b=1,c=1,d=1,e=7,f=1,g=1
constant:PL=1,DMV=1,DM=1,LC=1,NP=7,NM=1,BL=1
pattern:pattern3
cost:cost3
```

320-4:
```
netname:eco_net2
polynomial:M = aPL+bDMV+cDM+dLC+eNP+fNM+gBL
coefficient:a=8,b=7,c=1,d=1,e=1,f=1,g=1
constant:PL=7,DMV=6,DM=1,LC=1,NP=1,NM=1,BL=1
pattern:pattern8
cost:cost1
```

320-5:
```
netname:eco_net2
polynomial:M = aPL+bDMV+cDM+dLC+eNP+fNM+gBL
coefficient:a=1,b=1,c=1,d=1,e=7,f=1,g=1
constant:PL=1,DMV=1,DM=1,LC=1,NP=7,NM=1,BL=1
pattern:pattern9
cost:cost3
color:red
```

FIG. 17

M1 blue
VIA1 pink
M2 red
VIA2 purple
M3 green
VIA3 yellow
...

F I G. 1 8

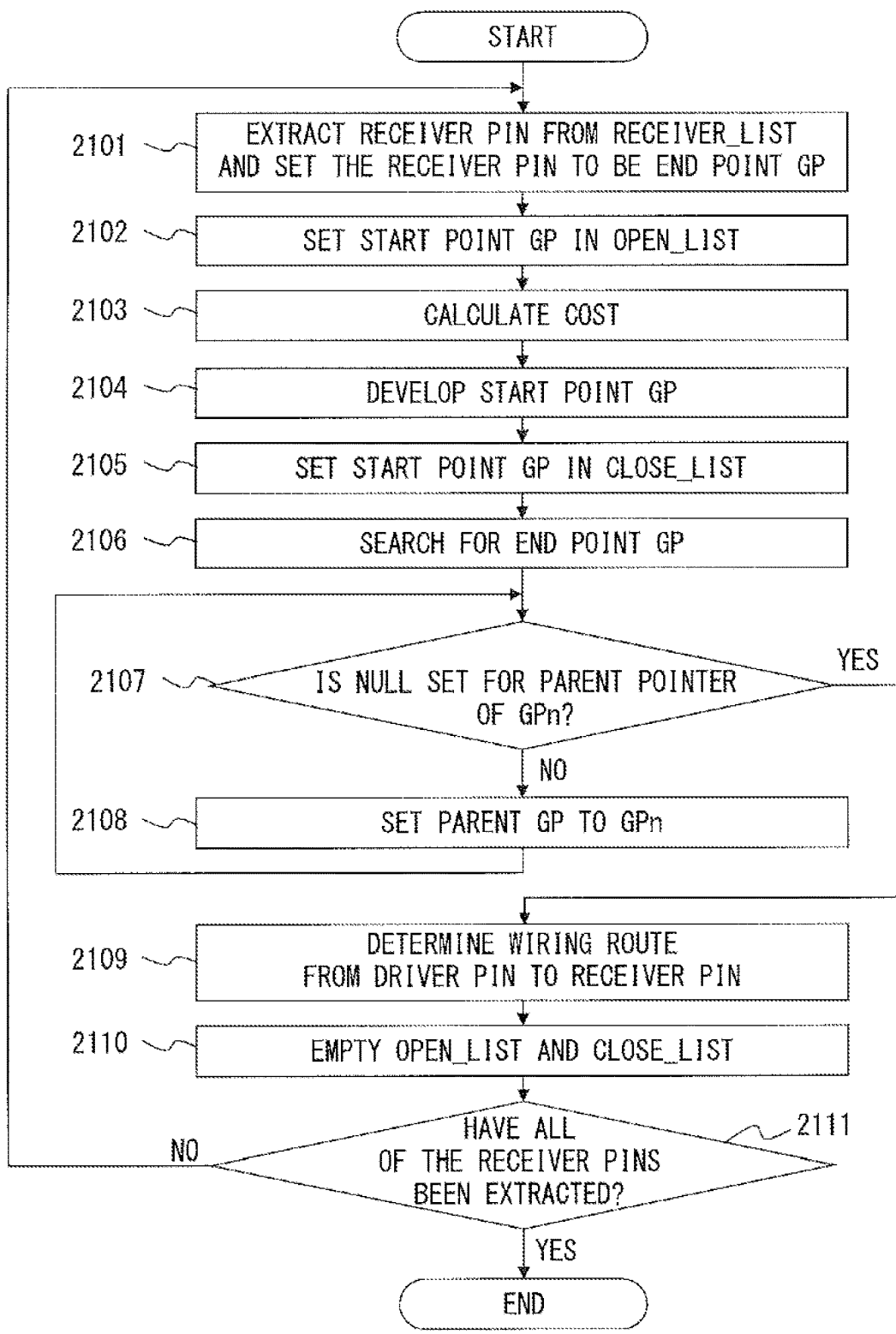
F I G. 2 1 ns particularly pointed out in the claims.

SEMICONDUCTOR DESIGN ASSISTING DEVICE AND SEMICONDUCTOR DESIGN ASSISTING METHOD

CROSS-REFERENCE TO RELATED APPLICATION

This application is based upon and claims the benefit of priority of the prior Japanese Patent Application No. 2015-256638, filed on Dec. 28, 2015, the entire contents of which are incorporated herein by reference.

FIELD

The embodiments discussed herein are related to a semiconductor design assisting device and a semiconductor design assisting method.

BACKGROUND

A semiconductor integrated circuit such as a large-scale integration (LSI) is often designed in order of a logical design being performed and then a physical design being performed, using an electronic design automation (EDA) tool. The physical design includes an arrangement of a logical element and a wiring design. The use of the EDA tool makes it possible to automatically perform a design that satisfies a design rule such as a mask design rule and a timing rule. In recent LSI designing, a conductor called a dummy metal may be inserted between wirings after the arrangement of the logical element and the wiring design in order to improve manufacturing yield for an LSI.

On the other hand, an engineering change order (ECO) is known as a technology that performs a logic change to or a timing modification of a semiconductor integrated circuit. According to the ECO, for example, the addition of or the change in a logical element, or the change in the arrangement of the logical element or the wiring, is performed with respect to data of a designed circuit. Specifically, the ECO after LSI chip manufacturing is called a post-mask ECO. In the post-mask ECO, only a mask of, for example, a portion of wiring layers is updated.

In wiring designing of a semiconductor integrated circuit or a printed-circuit board, a technology is also known that determines a wiring route between two points on the basis of a wiring cost (see, for example, Patent Documents 1 and 2).

Patent Document 1: Japanese Laid-open Patent Publication No. 2000-243838

Patent Document 2: Japanese Laid-open Patent Publication No. 2-133879

SUMMARY

According to an aspect of the embodiments, a semiconductor design assisting device includes a memory and a processor. The memory stores layout data of a semiconductor circuit. Upon performing a design change on the layout data, the processor searches for a plurality of wiring routes on the basis of a plurality of cost calculating formulas that respectively represent a plurality of design rules, and on the basis of the layout data, wherein the plurality of wiring routes are a plurality of candidates for a wiring route that corresponds to a processing target net that is connection information that needs to be changed in the semiconductor circuit, and respectively satisfy the plurality of design rules. Then, the processor generates display information that displays the plurality of wiring routes obtained by the search.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 illustrates a functional configuration of a semiconductor design assisting device;

FIG. 4B is (part 2 of) the flowchart that illustrates the specific example of the design changing processing;

FIG. 7 illustrates a result obtained when the design changing processing of an embodiment is used;

FIG. 10 illustrates a net list after a change;

FIG. 11 illustrates a net list for wiring;

FIG. 12 illustrates wiring route data;

FIG. 14 illustrates wiring display data;

FIG. 15 illustrates a cost default file;

FIGS. 16A and 16B illustrate cost files;

FIG. 17 illustrates cost files that represent a wiring-layer-number rule, a wiring-density rule, and a timing rule;

FIG. 18 illustrates a color definition file;

FIG. 21 is a flowchart of search processing;

DESCRIPTION OF EMBODIMENTS

Figure 2:
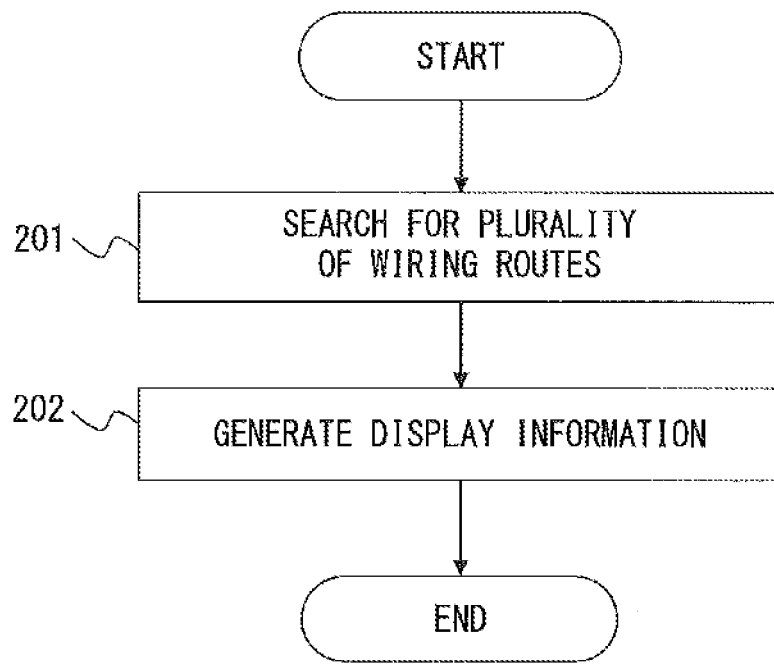
FIG. 2 is a flowchart of design changing processing.

Embodiments will now be described in detail with reference to the drawings.

In the post-mask ECO, when a wiring route that satisfies a specific design rule is obtained with respect to a processing target net (ECO net) that is connection information corresponding to a wiring that needs to be changed, there is a possibility that a designer will not be satisfied with the obtained wiring route. In this case, the designer repeats a process including changing a parameter of an EDA tool and obtaining another wiring route, so the operations will be complicated.

It is preferable that the number of and the range of masks to be updated be made smaller in the post-mask ECO in order to cut down the costs for development and to reduce the risk of causing a new problem due to a design change to a portion that has no existing problems. For this reason, it is preferable that a wiring-layer-number rule that specifies the number of wiring layers to be changed be set in addition to a mask-design rule and a timing rule.

The timing rule is a design rule that specifies a timing of a signal in a semiconductor circuit. The mask-design rule includes a wiring-density rule that specifies a wiring density in the semiconductor circuit. The use of the wiring-layer-number rule makes it possible to limit the number of wiring layers to be changed.

However, the timing rule, the wiring-density rule, and the wiring-layer-number rule have a trade-off relationship with one another. For example, if the number of wiring layers to be changed is small, it is possible to cut down the costs for updating a mask, but the layout is changed greatly and the wiring becomes longer. As a result, there may occur a breaking of the timing rule or a breaking of the wiring-density rule. Thus, the designer himself/herself will determine which of the design rules is to be preferentially used for the wiring of the ECO net.

In an automatic wiring program using an EDA tool, a wiring route is searched for by use of a cost in each grid point (node) in a wiring range. The cost of each node represents the difficulty in having wiring passed through the node, and a wiring route in which the sum of the costs of a plurality of nodes from a start point to an endpoint of the wiring is smallest is searched for. If these costs are controlled, it is possible to perform a wiring design that solves a specific design problem, such as wiring in which the timing rule has priority.

For example, in an A* search algorithm, the cost of a shortest route to arrive at an end point from a start point through a node n is obtained using the following formula.

$$f^*(n) = g^*(n) + h^*(n) \quad (1)$$

In Formula (1), $g^*(n)$ represents an estimated value of a minimum cost from the start point to the node n, and $h^*(n)$ represents an estimated cost from the node n to the end point. For example, the Manhattan distance from the node n to the end point is used for $h^*(n)$.

In this case, with respect to each adjacent node m that is adjacent to the node n, $f^*(m)$ upon passing through the adjacent node m is calculated by the following procedure.

1. Using a cost COST(n,m) upon moving from the node n to the node m, the cost from the start point to the node m is calculated by use of the following formula.

$$g'(m) = g^*(n) + COST(n,m) \quad (2)$$

2. When $g^*(m)$ is not calculated or when $g^*(m)$ satisfies $g'(m) < g^*(m)$, $g^*(m)$ is calculated or updated using the following formula.

$$g^*(m) = g'(m) \quad (3)$$

3. $f^*(m)$ is calculated using the following formula.

$$f^*(m) = g^*(m) + h^*(m) \quad (4)$$

In the post-mask ECO, a critical bug detected after LSI chip manufacturing is often fixed, so it is desirable that the development be completed within a short period of time in order to launch a mass-produced product onto the market promptly. However, when a wiring design is performed using a conventional EDA tool, it may take a long time to complete the development for the following reasons.

(1) The number of cost calculating formulas provided for one ECO net is one, so the number of wiring routes obtained as a result is also one. When the designer does not satisfy the obtained wiring route, he/she changes a cost calculating formula by changing a parameter that controls the automatic wiring program, so as to perform wiring again. A search result is tuned while repeating such a change in a cost calculating formula, so the operations will be complicated.

(2) In the automatic wiring program, wiring is performed by sequential processing for each ECO net, so a wired ECO net is treated as an obstacle. Thus, when wiring is performed on a plurality of ECO nets in an area with dense wiring, a wiring route is searched for while avoiding short circuiting of wiring between different ECO nets. In this case, a search condition is stricter with respect to an ECO net that is wired later, which results in having a difficulty in obtaining an optimal wiring route. Thus, the designer performs wiring on each ECO net after considering a wiring order of each ECO net, such as performing wiring on an ECO net with a strict design condition first.

(3) In the post-mask ECO, it is difficult to solve a problem in design using only an automatic wiring performed by the automatic wiring program, so wiring may be modified manually using a graphical user interface (GUI) after the automatic wiring is performed. However, it has become very difficult in recent years to analyze wiring using a GUI due to a complicated mask design rule created by microminiaturizing semiconductor manufacturing processing, due to a multi-layered wiring layer of an LSI chip, and due to the presence of a dummy metal included in layout data (including wiring information on a metal and arrangement information on a logical element). Further, it is difficult to determine which of the design rules has priority in wiring by just looking at a wiring route. For these reasons, a large number of man-hours are spent when wiring is modified manually using a GUI.

This problem occurs not only in a circuit change in the post-mask ECO but also in a design change to layout data of another semiconductor circuit.

FIG. 1 illustrates an example of a functional configuration of a semiconductor design assisting device according to an embodiment. A semiconductor design assisting device 101 of FIG. 1 includes a storage 111, a search unit 112, and a generator 113. The storage 111 stores layout data 121 of a semiconductor circuit. The search unit 112 performs design changing processing on the layout data 121, and the generator 113 generates display information that displays a wiring route obtained by performing the design changing processing.

FIG. 2 is a flowchart that illustrates an example of the design changing processing performed by the semiconductor design assisting device 101 of FIG. 1. First, as a candidate for a wiring route that corresponds to a processing target net that is connection information that needs to be changed in a semiconductor circuit, the search unit 112 searches for a plurality of wiring routes that satisfy a plurality of design rules respectively (Step 201). Here, the search unit 112 searches for those wiring routes on the basis of a plurality of cost calculating formulas that represent the plurality of design rules respectively, and on the basis of the layout data 121. The generator 113 generates display information that displays the plurality of wiring routes obtained by the search performed by the search unit 112 (Step 202).

According to the semiconductor design assisting device 101 of FIG. 1, it is possible to collectively obtain a plurality of wiring routes that satisfy a plurality of design rules respectively when a design change is performed on layout data of a semiconductor circuit.

Figure 3:
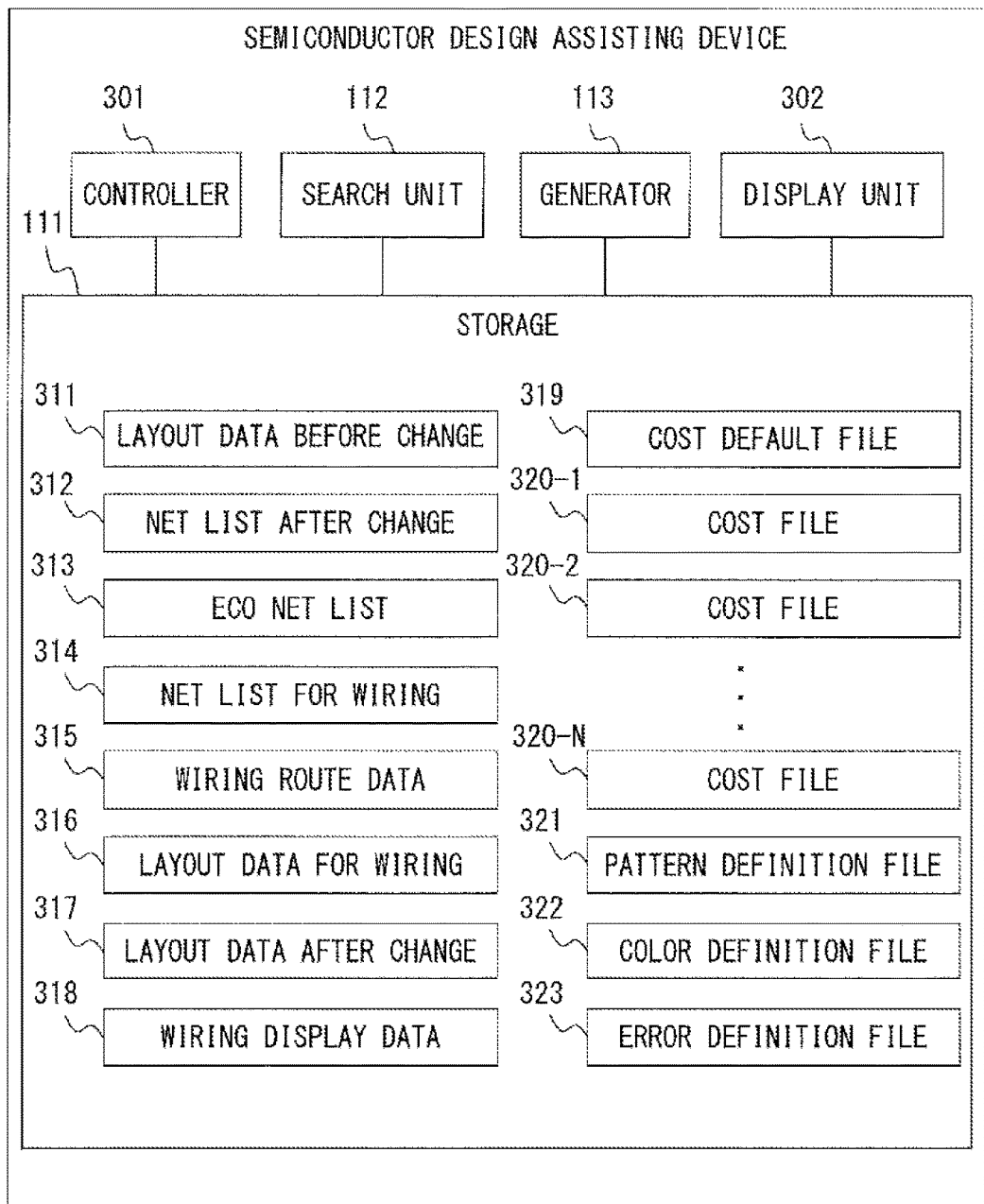
FIG. 3 illustrates a functional configuration of a specific example of the semiconductor design assisting device.

FIG. 3 illustrates a specific example of the semiconductor design assisting device 101 of FIG. 1. The semiconductor design assisting device 101 of FIG. 3 includes the storage 111, the search unit 112, the generator 113, a controller 301, and a display unit 302, and performs design changing processing for a logic change to a semiconductor circuit in the post-mask ECO.

The storage 111 stores layout data before change 311, a net list after change 312, an ECO net list 313, a net list for wiring 314, wiring route data 315, and layout data for wiring 316. The storage 111 further stores layout data after change 317, wiring display data 318, a cost default file 319, and cost files 320-1 to 320-N (N is an integer not less than one). The storage 111 further stores a pattern definition file 321, a color definition file 322, and an error definition file 323.

The layout data before change 311 corresponds to the layout data 121 of FIG. 1 and represents layout data of a semiconductor circuit before a logic change. The net list after change 312 represents a net list of a semiconductor circuit after a logic change and includes, for example, information on a newly added net. The ECO net list 313 represents a list of an ECO net that is a processing target net, and is generated from the net list after change 312. In the automatic wiring program, wiring is performed on the basis of a net list, so a net name that is identification information of an ECO net is determined by the net list after change 312.

The net list for wiring 314 is a net list that includes information on a net other than an ECO net and information on a plurality of search target nets that respectively correspond to a plurality of wiring routes generated for each ECO net. The net list for wiring 314 is generated from the net list after change 312 and the ECO net list 313.

The wiring route data 315 includes a set of a plurality of wiring routes generated for each ECO net, and includes a plurality of sets that correspond to a plurality of ECO nets, respectively. The layout data for wiring 316 is generated from the layout data before change 311 and changed on the basis of the wiring route data 315. The layout data after change 317 represents layout data in which all changes in the post-mask ECO are reflected, and is generated from the layout data for wiring 316.

The wiring display data 318 represents a cost calculating formula and a display pattern for each search target net in the net list for wiring 314. The cost default file 319 represents a default cost calculating formula, and a cost file 320-$i$ ($i=1$ to N) represents a cost calculating formula defined by a user. The pattern definition file 321 represents a display pattern used to display each wiring route on a screen, and the color definition file 322 represents a display color used to display each wiring route. The error definition file 323 represents an error display pattern used to indicate a location where wiring has been short circuited when short circuiting of wiring has occurred between wiring routes for ECO nets that are different from each other.

The controller 301 generates the ECO net list 313 and the net list for wiring 314 from the net list after change 312 and the layout data for wiring 316 from the layout data before change 311. The search unit 112 searches for a plurality of wiring routes for each ECO net using the net list for wiring 314, the layout data for wiring 316, the cost default file 319, and the cost files 320-1 to 320-N. Then, the search unit 112 generates the wiring route data 315 and the wiring display data 318 on the basis of a search result.

The generator 113 generates display information that displays each wiring route, using the wiring route data 315, the layout data for wiring 316, the wiring display data 318, the color definition file 322, and the error definition file 323. The display unit 302 displays each of the wiring routes using the display information generated by the generator 113. The controller 301 generates the layout data after change 317 that includes a wiring route selected by the user from among the plurality of wiring routes for each ECO net.

Figure 4A:
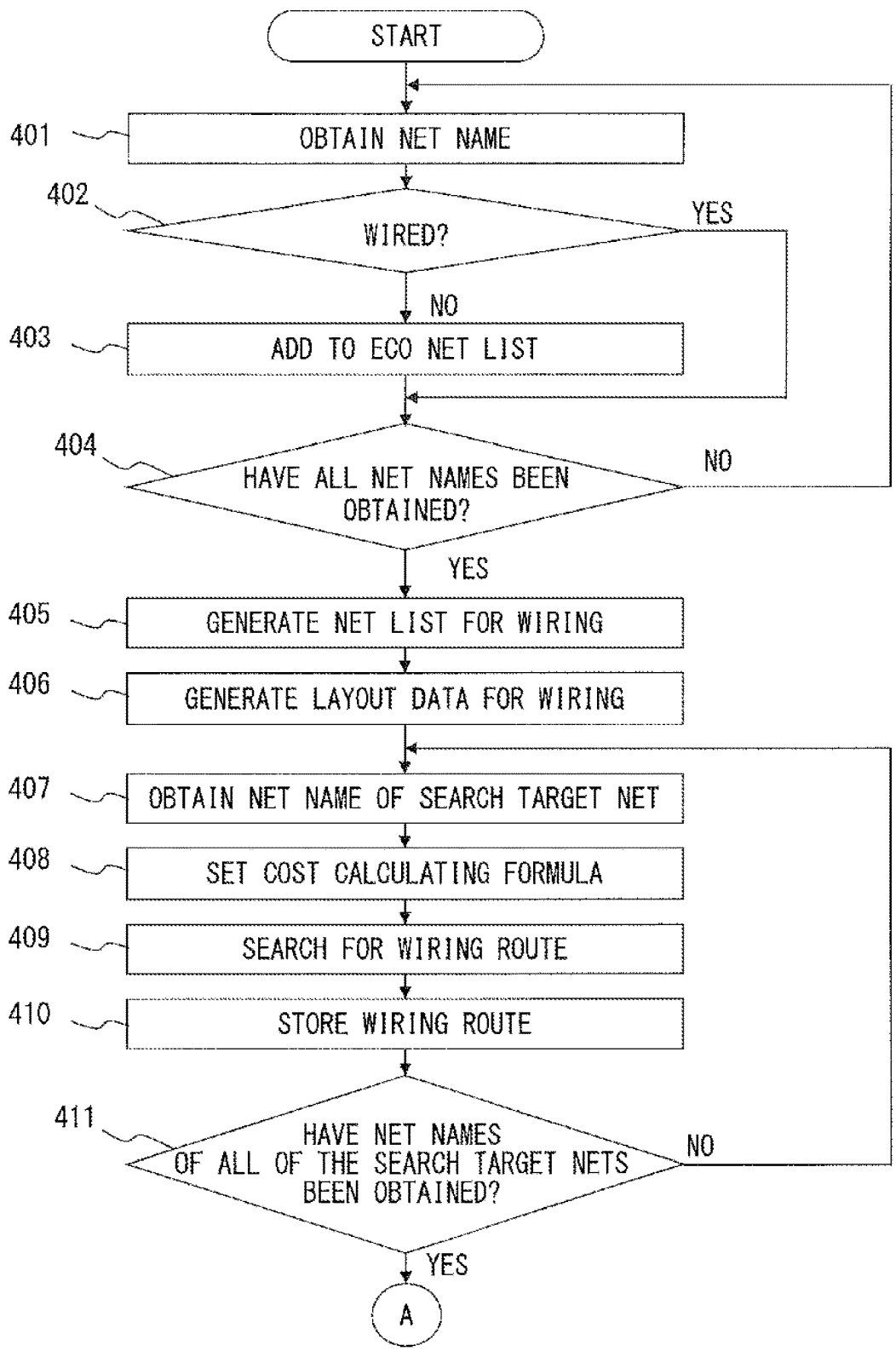
FIG. 4A is (part 1 of) a flowchart that illustrates a specific example of the design changing processing.

FIGS. 4A and 4B are a flowchart that illustrates a specific example of the design changing processing performed by the semiconductor design assisting device 101 of FIG. 3. First, the controller 301 obtains, from the net list after change 312, a net name that is identification information of each net (Step 401), and checks whether the net indicated by the obtained net name has been wired (Step 402).

When the net is unwired (Step 402, NO), the controller 301 adds the net to the ECO net list 313 (Step 403) and checks whether all net names have been obtained from the net list after change 312 (Step 404).

On the other hand, when the net has been wired (Step 402, YES), the controller 301 does not add the net to the ECO net list 313 and performs the processes of and after Step 404. When an obtained net name remains (Step 404, NO), the controller 301 repeats the processes of and after Step 401.

When all of the net names have been obtained (Step 402, YES), the controller 301 generates the net list for wiring 314 that includes a net other than an ECO net and a plurality of search target nets for each ECO net included in the ECO net list 313 (Step 405). Then, the controller 301 obtains, from the layout data before change 311, information on, for example, the size of a semiconductor circuit, a coordinate that represents the position of a logical element, a wiring route that connects between logical elements, a power wiring, and a dummy metal, so as to generate the layout data for wiring 316 (Step 406).

Next, the search unit 112 obtains a net name of each search target net from the net list for wiring 314 (Step 407). Then, on the basis of one of the cost files 320-1 to 320-N, the search unit 112 sets a cost calculating formula for a search target net indicated by the obtained net name (Step 408).

Next, the search unit 112 searches for a wiring route for the search target net by use of the set cost calculating formula, while referring to a circuit layout indicated by the layout data for wiring 316 (Step 409). Then, the search unit 112 stores, in the wiring route data 315, information on, for example, a wiring layer, a wiring width, and a coordinate representing a wiring position of a wiring route obtained by the search (Step 410). Here, the search unit 112 generates the wiring display data 318 that indicates the set cost calculating formula and a display pattern of the wiring route obtained by the search. The display pattern of the wiring route obtained by the search is selected from the pattern definition file 321.

Next, the search unit 112 checks whether net names of all of the search target nets have been obtained from the net list for wiring 314 (Step 411). When a net name of an unobtained search target net remains (Step 411, NO), the search unit 112 repeats the processes of and after Step 407.

In this case, in Step 408, the search unit 112 sets different cost calculating formulas for a plurality of search target nets generated from one ECO net. Further, in Step 409, the search unit 112 searches for a wiring route for a current search target net on the assumption that there does not exist a wiring route for a search target net which has been searched.

When the net names of all of the search target nets have been obtained (Step 411, YES), the generator 113 generates display information including a plurality of wiring routes for each ECO net on the basis of the wiring route data 315 and the layout data for wiring 316 (Step 412). Then, the display unit 302 displays each wiring route on the screen using the display information.

Next, the controller 301 receives, from a user, a selection instruction to select one wiring route from among the plurality of wiring routes for each ECO net, and determines the selected wiring route to be a wiring route for the ECO net (Step 413). Here, the controller 301 adds information on the selected wiring route to the layout data for wiring 316.

Next, the controller 301 checks whether wiring routes for all of the ECO nets have been determined (Step 414), and when an ECO net on which a determination has not been performed remains (Step 414, NO), it repeats the processes of and after Step 413.

When the wiring routes for all of the ECO nets have been determined (Step 414, YES), the controller 301 copies information on the layout data for wiring 316 so as to generate the layout data after change 317 (Step 415).

According to such design changing processing, a plurality of cost calculating formulas are set for one ECO net and a plurality of wiring routes are collectively searched for, so there is no need for the operations to change a cost calculating formula. For example, it becomes possible to search, at the same time, for a plurality of wiring routes that satisfy, for example, the timing rule, the wiring-density rule, and the wiring-layer-number rule.

Further, wiring routes based on different cost calculating formulas are respectively displayed using different display patterns, which permits a user to select a wiring route while checking on the screen a cost calculating formula that corresponds to each wiring route.

Furthermore, if a wiring route is searched for on the assumption that there does not exist a wiring route which has been obtained by performing a search, it is possible to search for a set of a plurality of wiring routes for a certain ECO net independently of a search result for another ECO net. Accordingly, it becomes possible to not take account of short-circuiting of wiring between ECO nets, which results in there being no need to consider a wiring order of an ECO net.

Thus, the design changing processing of FIGS. 4A and 4B permits a development period in the post-mask ECO to be shortened.

Figure 5:
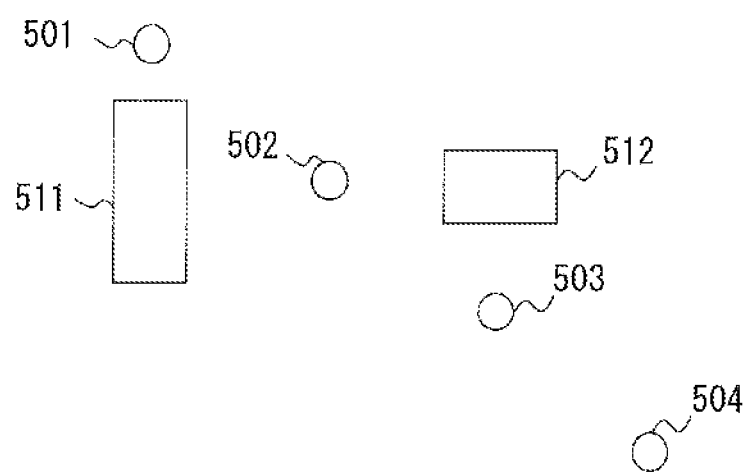
FIG. 5 illustrates a semiconductor circuit before a logic change.

FIG. 5 illustrates an example of a semiconductor circuit before a net is added due to a logic change. In this semiconductor circuit, wiring from a start point 501 to an end point 503 and wiring from a start point 502 to an end point 504 are generated while avoiding an obstacle 511 and an obstacle 512.

Figure 6:
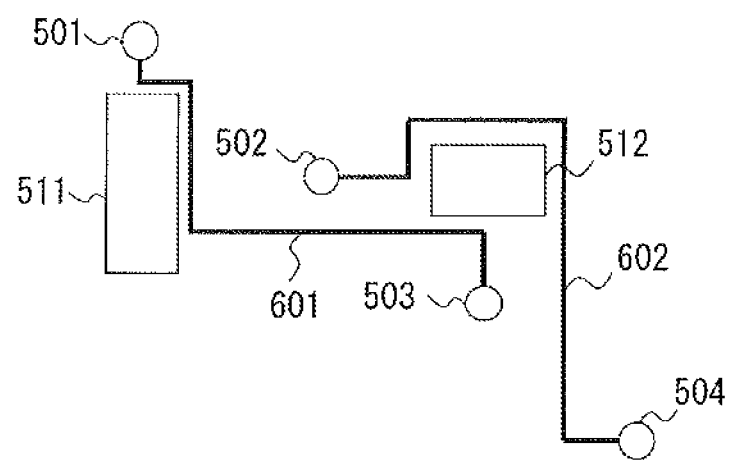
FIG. 6 illustrates a result obtained when conventional design changing processing is used.

FIG. 6 illustrates an example of a result obtained when conventional design changing processing is used for the semiconductor circuit of FIG. 5. First, a wiring route 601 is searched for with respect to an ECO net that includes the start point 501 and the end point 503, and a wiring route 602 is then searched for with respect to an ECO net that includes the start point 502 and the endpoint 504. The wiring route 601 is treated as an obstacle upon searching for the wiring route 602 after the determination of the wiring route 601, so the search is performed while avoiding the wiring route 601.

FIG. 7 illustrates an example of a result obtained when the design changing processing of FIGS. 4A and 4B is used for the semiconductor circuit of FIG. 5. First, the wiring route 601 and a wiring route 701 are searched for with respect to the ECO net that includes the start point 501 and the endpoint 503, and the wiring route 602 and a wiring route 702 are then searched for with respect to the ECO net that includes the start point 502 and the end point 504. The layout data for wiring 316 is referred to upon searching for a wiring route, and a wiring route obtained by the search is stored in the wiring route data 315.

Thus, the wiring route 601 is not included in the layout data for wiring 316 upon searching for the wiring route 701 after the search for the wiring route 601, so it is possible to search for the wiring route 701 that intersects with the wiring route 601. Likewise, it is also possible to search for the wiring route 602 and the wiring route 702 after the search for the wiring route 601 and the wiring route 701. Then, if the wiring route data 315 is merged with the layout data for wiring 316 after the search for all of the wiring routes with respect to each ECO net, display information that indicates the search result of FIG. 7 is generated.

Figure 8:
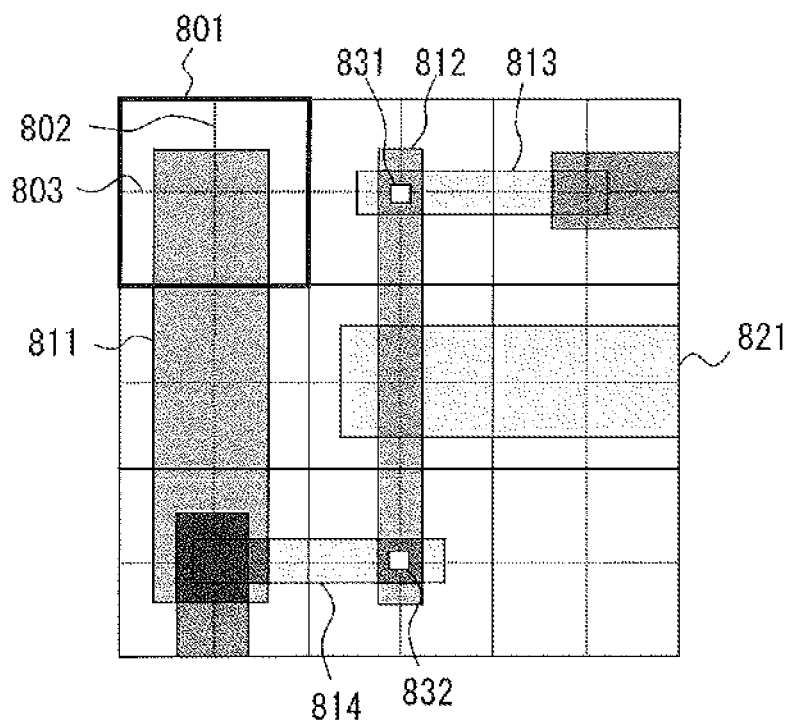
FIG. 8 illustrates a wiring area.

FIG. 8 illustrates an example of a wiring area in each wiring layer of a semiconductor circuit. A plurality of longitudinal wiring tracks 802 and a plurality of lateral wiring tracks 803 are provided in the wiring area, and a rectangular area 801 having its center at an intersection point of each longitudinal wiring track 802 and each lateral wiring track 803 is referred to as a grid point.

For example, a value obtained by adding a minimum spacing value to a wiring width of a normal wiring is used as a space between the longitudinal wiring tracks 802 and a space between the lateral wiring tracks 803. A wiring route obtained by a search is displayed on a wiring track, so it is possible to secure spacing between the obtained wiring route and a wiring route on an adjacent wiring track when the wiring route corresponds to the normal wiring. The wiring route from a grid point to a next grid point is searched for with respect to, for example, six directions in which switchings to up-and-down wiring layers are added to four directions of left, right, up, and down in the wiring area.

Metals 811 to 814 each represent a conductor used as a wiring through which a signal is transmitted, and a dummy metal 821 represents a conductor that is not used as wiring. Vias 831 and 832 each represent a conductor that connects metals in different wiring layers.

Figure 9:
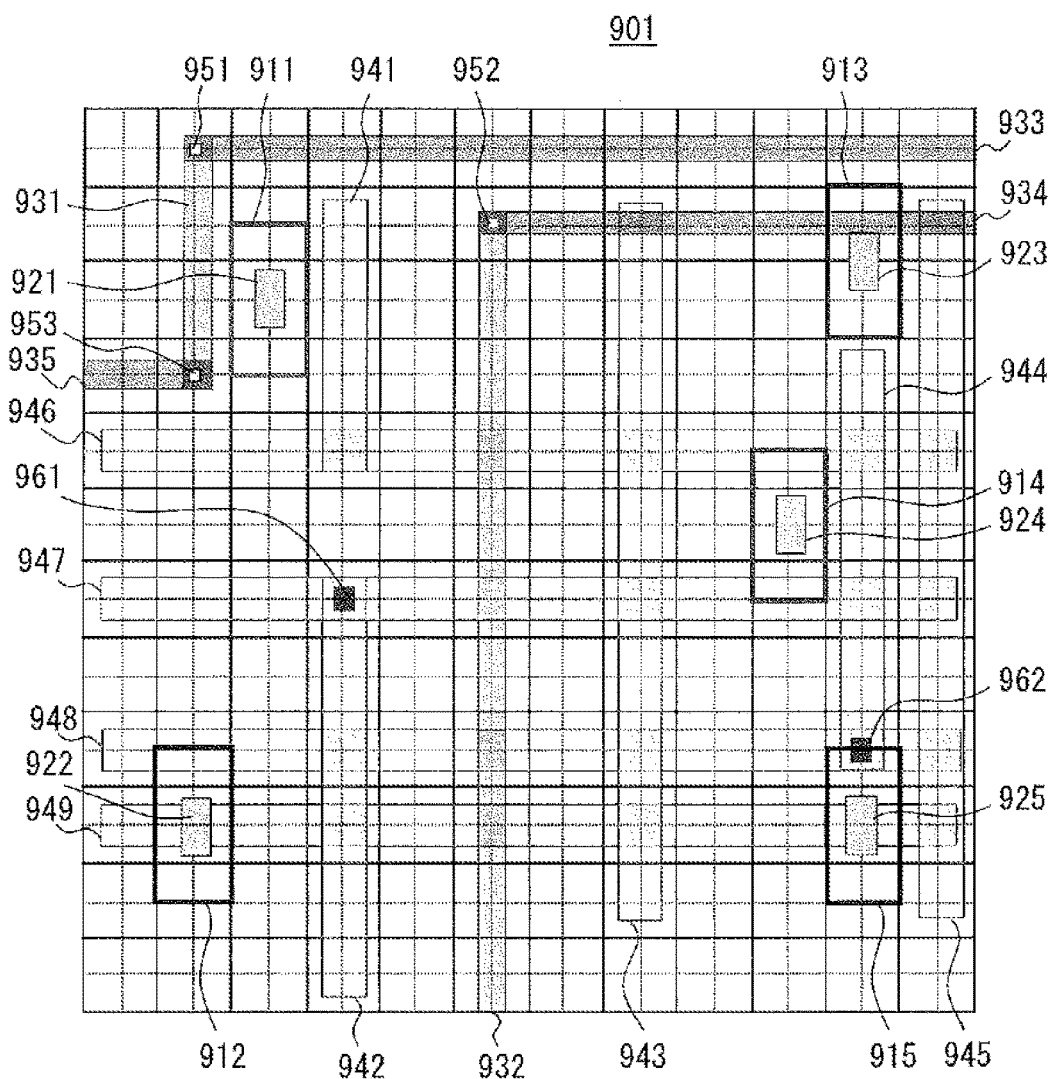
FIG. 9 illustrates a semiconductor circuit indicated by layout data before a change.

FIG. 9 illustrates an example of a semiconductor circuit indicated by the layout data before change 311. A die area 901 represents a wiring area in each wiring layer of the semiconductor circuit, and instances 911 to 915 represent logical elements. The instance 911 includes a driver pin 921, and the instance 912 includes a driver pin 922. The instance 913 includes a receiver pin 923, the instance 914 includes a receiver pin 924, and the instance 915 includes a receiver pin 925.

Metals 931 to 935 represent conductors used as wiring, and dummy metals 941 to 949 represent conductors that are not used as wiring. Vias 951 to 953 represent conductors that connect between metals in different wiring layers, and dummy vias 961 and 962 represent conductors that connect between dummy metals in different wiring layers.

FIG. 10 illustrates an example of the net list after change 312 in which a new net has been added in the post-mask ECO with respect to the semiconductor circuit of FIG. 9. The net list after change 312 of FIG. 10 is created using a Verilog hardware description language (Verilog-HDL) standardized by the Institute of Electrical and Electronic Engineers (IEEE).

"eco_net1" and "eco_net1" represent net names of two added ECO nets, "cellA" to "cellE" represent cell names of logical elements, and "instA" to "instE" represent instance names of logical elements. "instA" to "instE" and the instances 911 to 915 of FIG. 9 have the following correspondence relationships.

| Instance 911 | instD |
|---|---|
| Instance 912 | instA |
| Instance 913 | instB |
| Instance 914 | instE |
| Instance 915 | instC |

Pieces of connection information starting with "cellA" to "cellC" are pieces of connection information on the ECO net "eco_net1", and pieces of connection information starting with "cellD" and "cellE" are pieces of connection information on the ECO net "eco_net2".

For example, the connection information "cellA instA(.A (in),.X(eco_net1))" indicates that the driver pin 922 (X) of the instance 912 (instA) is to be connected to the ECO net "eco_net1". Further, the connection information "cellB instB(.A(eco_net1),.X(out1))" indicates that the receiver pin 923 (A) of the instance 913 (instB) is to be connected to the ECO net "eco_net1".

In addition to the pieces of information on "eco_net1" and "eco_net1" of FIG. 10, the net list after change 312 also includes pieces of information on other nets that are not to be processed in the post-mask ECO.

FIG. 11 illustrates an example of the net list for wiring 314 generated from the net list after change 312 of FIG. 10. The controller 301 copies a net name of each ECO net in the net list after change 312 and generates net names for the same number of search target nets as the number of cost calculating formulas to be set.

For example, when the three cost calculating formulas "cost1", "cost2", and "cost3" are set for the ECO net "eco_net1", the following three net names are generated from "eco_net1".

| eco_net1_cost1 |
|---|
| eco_net1_cost2 |
| eco_net1_cost3 |

"cost1", "cost2", and "cost3" placed at the ends of the respective net names represent pieces of identification information of a cost calculating formula. Further, when the two cost calculating formulas "cost1" and "cost3" are set for the ECO net "eco_net1", the following two net names are generated from "eco_net1".

| eco_net2_cost1 |
|---|
| eco_net2_cost3 |

In this case, "eco_net1" and "eco_net1" in the net list after change 312 are not used as a net name in the net list for wiring 314.

Next, the controller 301 copies the connection information on each ECO net in the net list after change 312 and generates connection information on a corresponding search target net. Thus, the pieces of connection information on the ECO net "eco_net1" that start with "cellA" to "cellC" are each copied three times. The pieces of connection information on the ECO net "eco_net1" that start with "cellD" and "cellE" are each copied twice.

Here, the net name of each ECO net is changed to the net name of the search target net, and the instance name of each instance is changed to the instance name in a search target net. For example, "instA" in a search target net for which the cost calculating formula "cost1" is set is changed to "instA_cost1". "instA" in a search target net for which the cost calculating formula "cost2" is set is changed to "instA_cost2". In this case, "instA" to "instE" in the net list after change 312 are not used as an instance name in the net list for wiring 314.

However, the type and the coordinate of a logical element indicated by an instance name after change in the net list for wiring 314 are identical to the type and the coordinate of a logical element indicated by an original instance name in the net list after change 312.

For example, the following three pieces of connection information are generated from the connection information "cellA instA(.A(in),.X(eco_net1))" of FIG. 10.

| cellA instA_cost1(.A(in),.X(eco_net1_cost1)) |
|---|
| cellA instA_cost2(.A(in),.X(eco_net1_cost2)) |
| cellA instA_cost3(.A(in),.X(eco_net1_cost3)) |

Further, the following two pieces of connection information are generated from the connection information "cellD instD(.A(in),.X(eco_net1))" of FIG. 10.

| cellD instD_cost1(.A(in),.X(eco_net2_cost1)) |
|---|
| cellD instD_cost3(.A(in),.X(eco_net2_cost3)) |

In addition to the pieces of information on the five search target nets of FIG. 11, the net list for wiring 314 also includes pieces of information on other nets that are not to be processed in the post-mask ECO.

FIG. 12 illustrates an example of the wiring route data 315 obtained by searching for a wiring route on the basis of the net list for wiring 314 of FIG. 11. The wiring route data 315 of FIG. 12 includes identification information of the start point and the endpoint of a wiring route for each search target net, and information on the wiring layer and the coordinate of a grid point through which the wiring route passes.

For example, in route information starting with "−eco_net1_cost1", "instA_cost1X" represents a start point of the search target net "eco_net1_cost1". Further, "instB_cost1A" and "instC_cost1A" each represent an endpoint of the search target net "eco_net1_cost1".

In a next line of the same route information, "M3" represents identification information of a wiring layer, and "87300 41940" and "87930*" each represent a coordinate of a grid point in the wiring layer "M3". In this case, "*" indicates a value identical to the coordinate "41940" described just before it.

The wiring route data 315 is not reflected in the layout data for wiring 316 when the wiring route data 315 has been generated, so a wiring route for another search target net which has been obtained by a search will not be an obstacle upon searching for a wiring route for each search target net.

Figure 13:
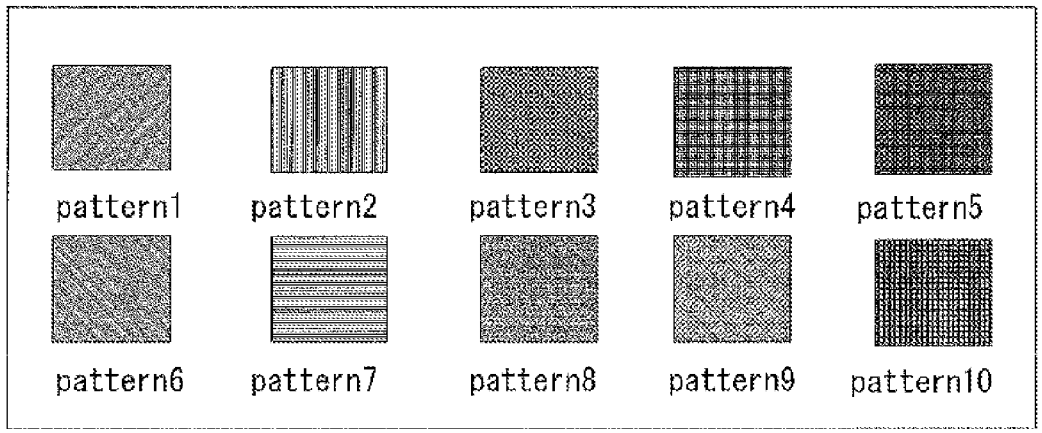
FIG. 13 illustrates a pattern definition file.

FIG. 13 illustrates an example of the pattern definition file 321. In this example, ten types of display patterns "pattern1" to "pattern10" are defined.

FIG. 14 illustrates an example of the wiring display data 318 generated by searching for a wiring route on the basis of the net list for wiring 314 of FIG. 11. In this example, a different display pattern is used for each set cost calculating formula in order to easily recognize a correspondence relationship between a wiring route and a cost calculating formula upon displaying a plurality of wiring routes for each ECO net at the same time.

For example, "eco_net1_cost1cost1pattern1" indicates that the cost calculating formula "cost1" is set for the search target net "eco_net1_cost1" and that its wiring route is displayed using "pattern1". "eco_net1_cost2cost2pattern2" indicates that the cost calculating formula "cost2" is set for the search target net "eco_net1_cost2" and that its wiring route is displayed using "pattern2".

FIG. 15 illustrates an example of the cost default file 319. "default polynomial" represents a default cost calculating formula for calculating a cost M at each grid point, and each term of "default polynomial" represents a cost value that corresponds to a specific attribute of the grid point. "default coefficient" represents a coefficient in each of the terms of "default polynomial", and "default constant" represents a variable in each of the terms of "default polynomial".

In the auto wiring program, a dummy metal is treated as an obstacle which does not allow passage of wiring, so it is difficult to search for a wiring route in a wiring area in which there exists a dummy metal. Thus, in conventional design changing processing, it is often the case that a dummy metal is deleted before a wiring route for an ECO net is searched for and the dummy metal is inserted again after the search is completed.

On the other hand, in the case of "default polynomial" of FIG. 15, a dummy metal is not treated as an obstacle but as a cost that represents the difficulty in having wiring passed. In this case, it is possible to search for a wiring route in a state in which there exists the dummy metal, so there is no need to perform processing of deleting and inserting the dummy metal.

aPL is a cost value that indicates a use-prohibited layer for which a mask is not updated in the post-mask ECO. Thus, aPL is used when there exists a grid point in a wiring area of a use-prohibited layer. In this example, a=1 and PL=7.

bDMV is a cost value indicating that there exists a dummy metal and a dummy via. Thus, bDMV is used when there exists a dummy metal at a grid point and there exists a dummy via on the dummy metal. In this example, b=1 and DMV=6.

cDM is a cost value indicating that there only exists a dummy metal. Thus, cDM is used when there exists a dummy metal at a grid point and there exists no dummy via on the dummy metal. In this example, c=1 and DM=5.

dLC is a cost value that indicates a direction of switching of a wiring layer. The switching direction is upward when the wiring route is changed to a wiring layer situated above a wiring layer in which there exists a grid point, and the switching direction is downward when the wiring route is changed to a wiring layer situated below the wiring layer in which there exists a grid point. dLC is used when the switching direction at a grid point is a specific direction. In this example, d=1 and LC=4.

eNP is a cost value indicating that a wiring direction is a non-prioritized direction. For each wiring layer, either a longitudinal direction or a lateral direction in a wiring area is set to be a prioritized direction of the wiring, wherein the non-prioritized direction is a direction different from the prioritized direction. eNP is used when a wiring direction at a grid point is a non-prioritized direction. In this example, e=1 and NP=3.

fNM is a cost value indicating that there exists a metal used as wiring. Thus, fNM is used when there exists a metal at a grid point. In this example, f=1 and NM=2.

gBL is a cost value indicating a wiring-prohibited layer that is a wiring layer in which a wiring route is prohibited from passing for each grid point, the wiring-prohibited layer being included in wiring layers other than the use-prohibited layer. Thus, gBL is used when the wiring-prohibited layer is set for a grid point. In this example, g=1 and BL=1.

A value other than the values described above can be used as a coefficient or a variable in each term of "default polynomial", or one or multiple terms that represent cost values other than the cost values described above can be added. "default polynomial" of the cost default file 319 is used as a cost calculating formula when a cost file 320-i is not used or when a cost file 320-i that does not define a cost calculating formula is used.

For example, when searching for a wiring route using the wiring-layer-number rule that limits the number of wiring layers to be changed, aPL, which is the largest cost value, is used and the cost M becomes larger if a grid point exists in a use-prohibited layer. bDMV, which is the second largest cost value, is used and the cost M becomes larger if there exists a dummy via on a dummy metal. Thus, there is a good possibility that a wiring route that does not passes through such a grid point will be obtained.

If there exists a dummy via on a dummy metal, there also occurs a change to a wiring layer situated above or below that is connected by the dummy via when the arrangement of the dummy metal is changed in order to have wiring passed, which results in an increase in the costs for updating a mask. Thus, a cost calculating formula including bDMV provides the advantage of cutting down the costs for updating a mask.

When an LSI chip is manufactured, a dummy metal has been inserted such that the wiring-density rule is satisfied, so it is effective if the dummy metal is not changed upon searching for a wiring route using the wiring-density rule. In this case, if cDM is set to a relatively large value, this provides the advantage of suppressing a change in a dummy metal.

Upon searching for a wiring route using the timing rule, dLC is used when a delay is increased by adding a via with the switching of a wiring layer. eNP is used when a delay is increased due to an unnecessary wiring crank. In this case, if dLC and eNP are set to be relatively large values, this provides the advantage of suppressing an increase in a delay. Further, if wiring which does not need to be changed is changed, this may cause a new timing error due to a change in a parasitic RC. Thus, fNM also has an influence on the timing rule.

In addition, the cost M can also be calculated using, according to the design rule, a cost calculating formula including gBL or a cost calculating formula in which a term other than each of the terms of FIG. 15 has been added.

FIGS. 16A and 16B illustrate examples of cost files 320-i. A user can define a cost calculating formula according to the design rule using a cost file 320-i. For example, if a coefficient in each term. of "default polynomial" is changed, it is possible to set a plurality of cost calculating formulas that represent the wiring-layer-number rule, the wiring-density rule, and the timing rule.

"netname" represents a net name of an ECO net, "layer define" represents a target for which each term of a cost calculating formula is used, and "polynomial" represents the cost calculating formula for calculating the cost M at each grid point. "coefficient" represents a coefficient in each term of the cost calculating formula, and "constant" represents a variable in each term of the cost calculating formula. "pattern" represents identification information of a display pattern of a wiring route, "cost" represents identification information of the cost calculating formula, and "color" represents identification information of a display color of the wiring route.

FIGS. 16A and 16B illustrate two different cost files 320-$i$ for an ECO net "neta". In the cost calculating formula of FIG. 16A, newly added hCL is used in addition to aPL and gBL of FIG. 15. hCL is used when a grid point exists in CAD_LAYER that is a prescribed wiring layer. In this example, a=1, g=0.1, h=0.9, PL=7, BL=1, and CL=1.

On the other hand, a cost calculating formula is omitted in the cost file 320-$i$ of FIG. 16B. In this case, "default polynomial" of the cost default file 319 is used as a cost calculating formula.

FIG. 17 illustrates examples of cost files 320-$i$ used for searching for a wiring route on the basis of the net list for wiring 314 of FIG. 11. The cost files 320-1 to 320-3 are used for the ECO net "eco_net1", and the cost files 320-4 and 320-5 are used for the ECO net "eco_net2".

The cost file 320-1 represents the wiring-layer-number rule, in which the coefficient "a" of aPL indicating a use-prohibited layer and the coefficient "b" of bDVM indicating that there exists a dummy via on a dummy metal are set to values larger than those of the coefficients in the other terms. The cost file 320-2 represents the wiring-density rule, in which the coefficient "b" of bDVM and the coefficient "c" of cDM each indicating that there exists a dummy metal are set to values larger than those of the coefficients in the other terms. The cost file 320-3 represents the timing rule, in which the coefficient "e" of eNP indicating that the wiring direction is a non-prioritized direction is set to a value larger than those of the coefficients in the other terms.

Likewise, the cost file 320-4 represents the wiring-layer-number rule, and the cost file 320-5 represents the timing rule.

FIG. 18 illustrates an example of the color definition file 322. "M1" to "M3" and "VIA1" to "VIA3" each represent identification information of a wiring layer, and "blue", "pink", "red", "purple", "green", and "yellow" each represent identification information of a display color. For example, the wiring route in the wiring layer "M1" is displayed in blue, the wiring route in the wiring layer "M2" is displayed in red, and the wiring route in the wiring layer "M3" is displayed in green.

Figure 19:
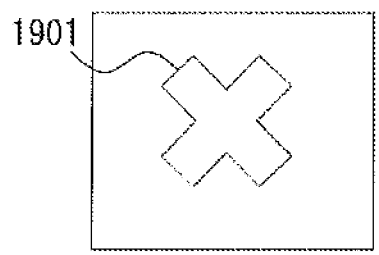
FIG. 19 illustrates an error definition file.

FIG. 19 illustrates an example of the error definition file 323. When short circuiting of wiring has occurred between wiring routes for different ECO nets in a wiring area, an error display pattern 1901 is displayed in a location where wiring has been short circuited.

Next, an example of processing of searching for a wiring route in step 409 of FIG. 4A is described with reference to FIGS. 20 to 23. In this example, an A* search algorithm is used, and a grid point (GP) is used as a node on a wiring route. COST(n,m) in Formula (2) that represents a cost upon moving from GPn to GPm is represented by the sum of a distance between GPn and GPm and a cost M(m) at GPm. GPm is adjacent to GPn, so the distance between GPn and GPm is "1". In this case, COST(n,m) is calculated using the following formula.

$$COST(n,m) = M(m) + 1 \quad (5)$$

The cost M(m) in Formula (5) is calculated using the cost calculating formula of the cost default file 319 or the cost file 320-$i$, and f*(m) in Formula (4) is calculated using COST (n,m). Then, if GPm in which a cost from a start point GP to an end point GP is minimal is selected according to f*(m), a wiring route according to the cost calculating formula is obtained.

Figure 20:
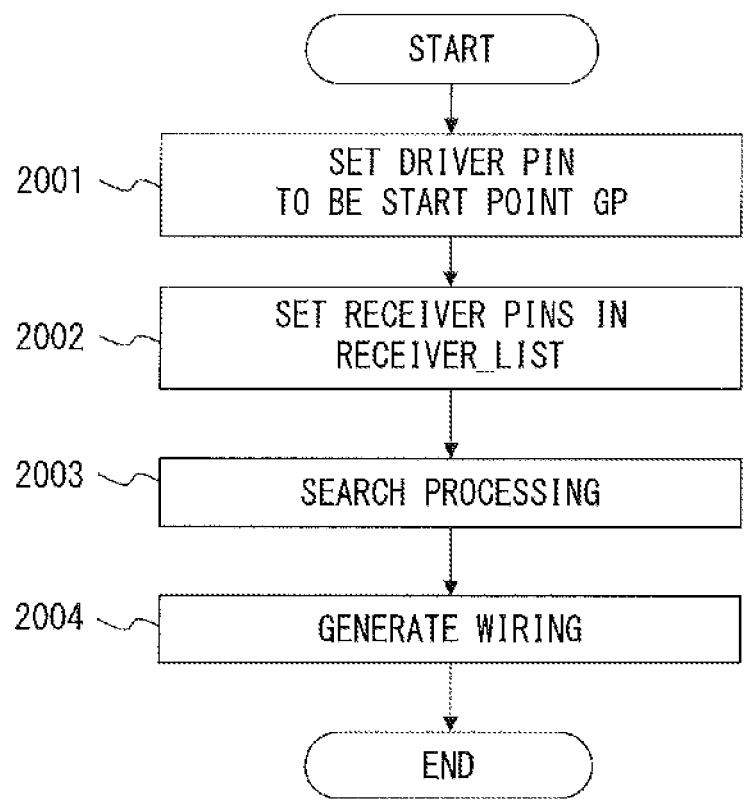
FIG. 20 is a flowchart of processing of searching for a wiring route.

FIG. 20 is a flowchart that illustrates an example of the processing of searching for a wiring route in Step 409 of FIG. 4A. First, the search unit 112 sets, to be a start point GP, a GP that includes a driver pin of a search target net indicated by a net name obtained in Step 407 (Step 2001). Then, the search unit 112 sets all of the receiver pins of the search target net in RECEIVER_LIST (Step 2002). RECEIVER_LIST represents a list of one or more receiver pins that are connected to an ECO net.

Next, the search unit 112 searches for a wiring route using the cost calculating formula set in Step 408 (Step 2003), and generates wiring that indicates a wiring route obtained by the search (Step 2004).

FIG. 21 is a flowchart that illustrates an example of search processing in Step 2003 of FIG. 20. First, the search unit 112 extracts one receiver pin from RECEIVER_LIST and sets the receiver pin to be an end point GP (Step 2101).

Next, the search unit 112 sets the start point GP in OPEN_LIST (Step 2102). OPEN_LIST is a list that stores an unvisited GP, and holds a parent pointer and identification information of a wiring layer for each GP.

The parent pointer is a pointer that indicates a parent GP that is a development source GP. For example, when GPn is developed in six directions (four directions of left, right, up, and down as well as switchings to up-and-down wiring layers), a parent GP for the six GPs that are development destinations is GPn. However, there exists no parent GP for a start point GP, so NUL is set for the parent pointer of a start point GP.

Next, the search unit 112 sets the start point GP to GPn which represents a development source GP, so as to calculate a cost f*(n) of GPn (Step 2103). f*(n) represents a cost of a shortest route to reach the endpoint GP from the start point GP through GPn and is calculated using Formula (1). When GPn is the start point GP, g*(n) in Formula (1) is zero.

Next, the search unit 112 develops the start point GP in the six directions so as to obtain adjacent GPs in the six directions (Step 2104), and extracts the start point GP from OPEN_LIST so as to set the start point GP in CLOSE_LIST (Step 2105). CLOSE_LIST is a list that stores a visited GP and holds a parent pointer, identification information of a wiring layer, and a cost f*(n) for each GP.

Next, the search unit 112 searches for the end point GP while repeatedly setting, to GPn, each of the adjacent GPs that are development destination GPs to develop GPn (Step 2106). When GPn matches the end point GP, the search unit 112 checks the parent pointer of GPn (Step 2107).

When NULL is not set for the parent pointer of GPn (Step 2107, NO), the search unit 112 sets the parent GP indicated by the parent pointer to GPn (Step 2108) and repeats the processes of and after Step 2107. In Step 2108, when the parent GP indicated by the parent pointer belongs to a wired net, the search unit 112 obtains its net name. This makes it possible to change the wiring route of the net indicated by the obtained net name.

When NULL is set for the parent pointer of GPn (Step 2107, YES), the search unit 112 determines that GPn matches the start point GP. Then, the search unit 112 determines, to be a wiring route from a driver pin to a receiver pin, the route that connects each GP which has been visited until the start point GP is reached from the end point GP (Step 2109), and empties OPEN_LIST and CLOSE_LIST (Step 2110).

Next, the search unit 112 checks whether it has extracted all of the receiver pins from RECEIVER_LIST (Step 2111), and when an unextracted receiver pin remains (Step 2111, NO), it repeats the processes of and after Step 2101. Then, when it has extracted all of the receiver pins (Step 2111, YES), the search unit 112 terminates the processing.

Figure 22:
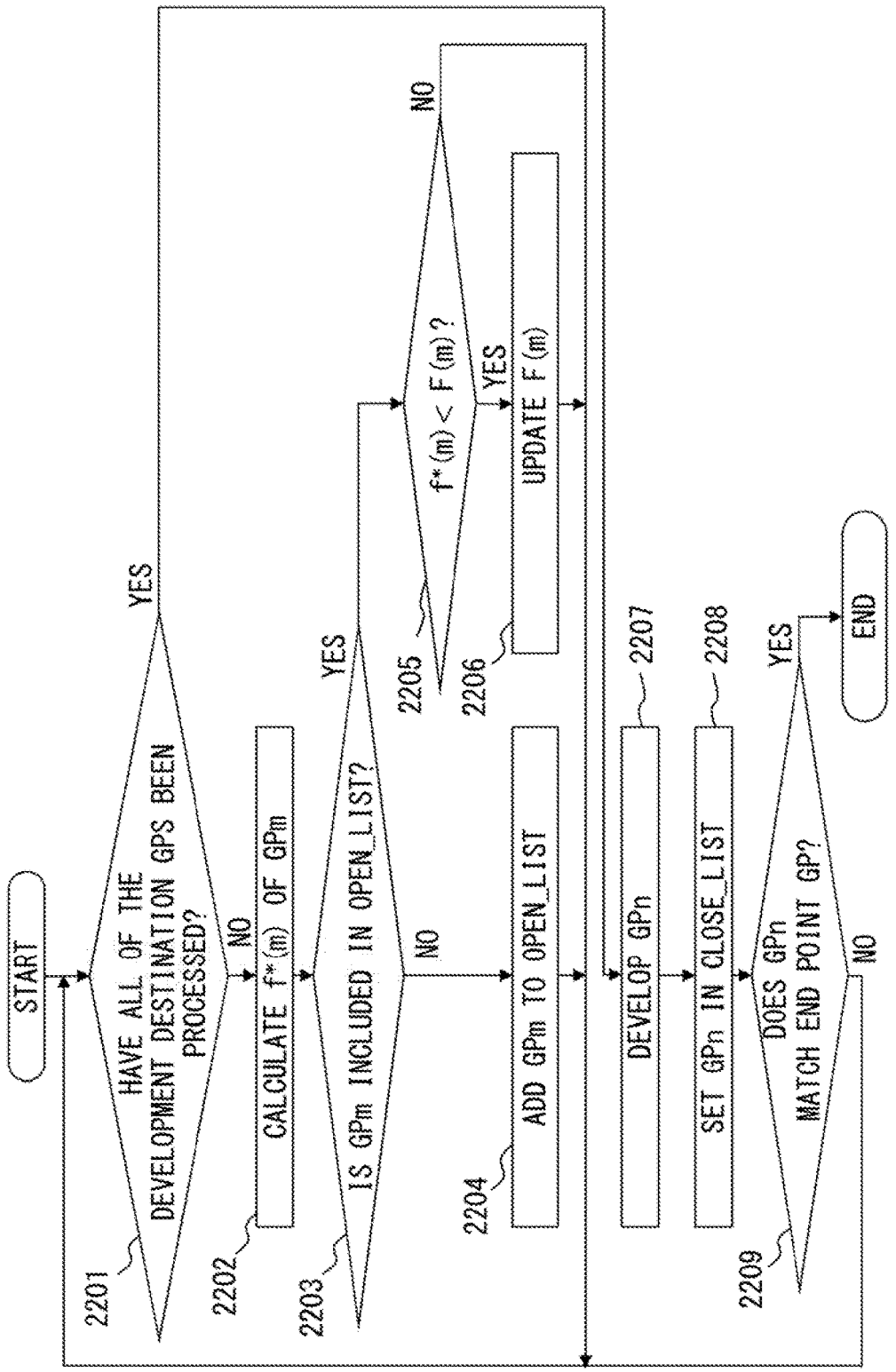
FIG. 22 is a flowchart of processing of searching for an end point GP.

FIG. 22 is a flowchart that illustrates an example of processing of searching for the end point GP in Step 2106 of FIG. 21. First, the search unit 112 checks whether it has processed all of the development destination GPs (Step 2201).

When an unprocessed development destination GP remains (Step 2201, NO), the search unit 112 sets one development destination GP to GPm, so as to calculate a cost f*(m) of GPm using Formula (2) to Formula (5) (Step 2202).

Next, the search unit 112 checks whether Gpm is included in OPEN_LIST (Step 2203). When GPm is not included in OPEN_LIST (Step 2203, NO), the search unit 112 sets calculated f*(m) to F(m), adds GPm to OPEN_LIST (Step 2204), and repeats the processes of and after Step 2201.

On the other hand, when GPm is included in OPEN_LIST (Step 2203, YES), the search unit 112 compares calculated f*(m) with F(m) (Step 2205). When f*(m) is less than F(m) (Step 2205, YES), the search unit 112 sets f*(m) to F(m) so as to update F(m), and repeats the processes of and after Step 2201. On the other hand, when f*(m) is not less than F(m) (Step 2205, NO), the search unit 112 repeats the processes of and after Step 2201 without updating F(m).

When it has processed all of the development destination GPs (Step 2201, YES), the search unit 112 selects GPm having a minimum F(m) from among GPms stored in OPEN_LIST (Step 2207). Then, the search unit 112 sets selected GPm to GPn, so as to develop GPn in the six directions.

Next, the search unit 112 extracts GPn, which is a development source GP from OPEN_LIST, so as to set extracted GPn in CLOSE_LIST (Step 2208). Then, the search unit 112 checks whether GPn matches the end point GP (Step 2209).

When GPn does not match the end point GP (Step 2209, NO), the search unit 112 repeats the processes of and after Step 2201. When GPn matches the end point GP (Step 2209, YES), the search unit 112 terminates the processing.

Figure 23:
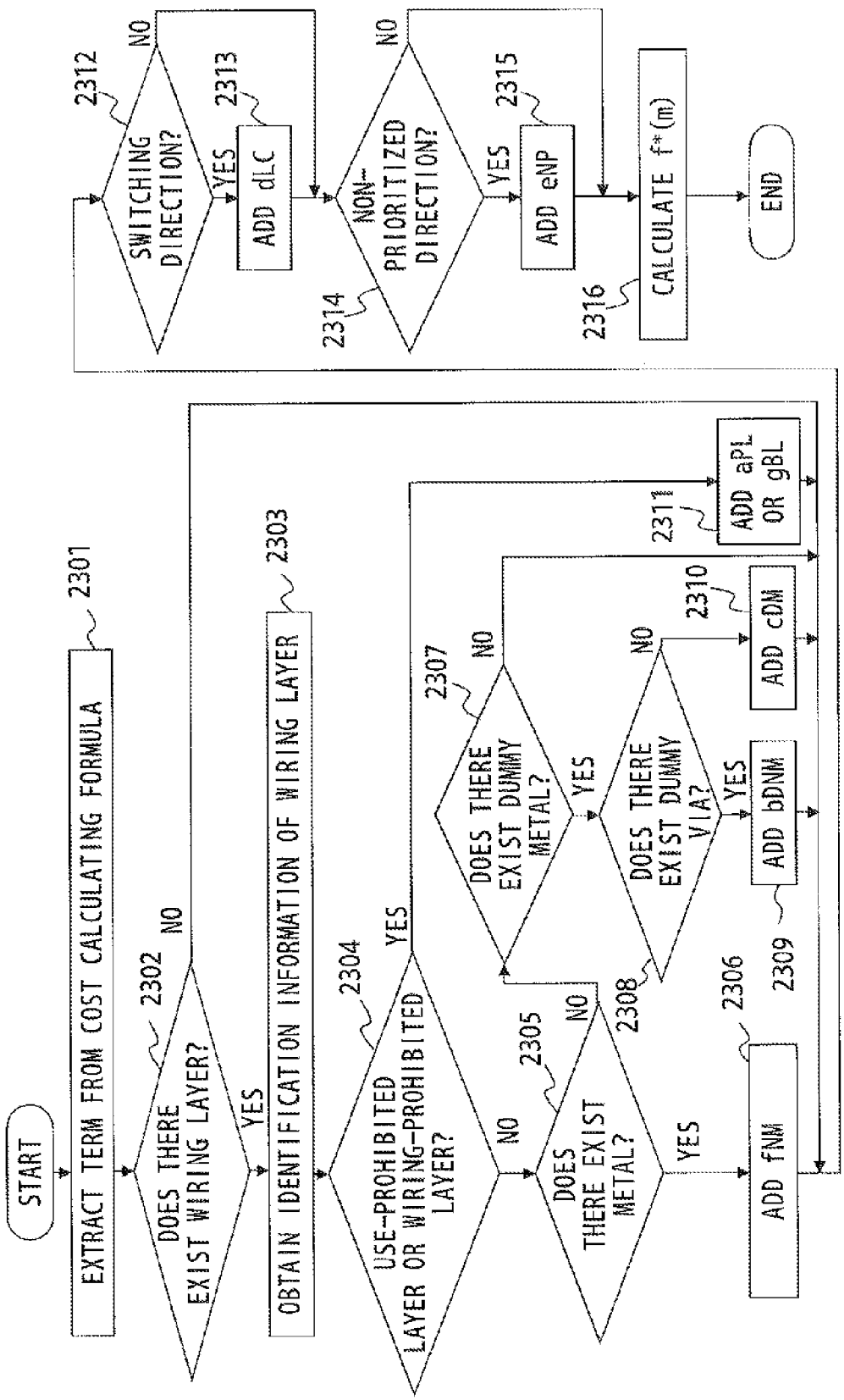
FIG. 23 is a flowchart of cost calculation processing.

FIG. 23 is a flowchart that illustrates an example of cost calculation processing in Step 2202 of FIG. 22. First, the search unit 112 extracts each term from a cost calculating formula set for a search target net (Step 2301).

Next, the search unit 112 refers to the layout data for wiring 316 so as to check whether there exists a wiring layer that corresponds to GPm (Step 2302). When there exists a wiring layer that corresponds to GPm (Step 2302, YES), the search unit 112 obtains identification information of the wiring layer (Step 2303). Then, the search unit 112 checks whether the obtained identification information corresponds to a use-prohibited layer or a wiring-prohibited layer (Step 2304).

When the obtained identification information does not correspond to a use-prohibited layer or a wiring-prohibited layer (Step 2304, NO), the search unit 112 checks whether there exists a metal, in GPm, that is used as wiring (Step 2305). When there exists a metal in GPm that is used as wiring and when the term of fNM is included in the cost calculating formula (Step 2305, YES), the search unit 112 adds the cost value fNM to the cost M(m) (Step 2306).

Next, the search unit 112 checks whether the movement from GPn to GPm corresponds to a switching direction for which dLC is used (Step 2312). When the movement from GPn to GPm corresponds to the switching direction and when the term of dLC is included in the cost calculating formula (Step 2312, YES), the search unit 112 adds the cost value dLC to the cost M(m) (Step 2313).

Next, the search unit 112 checks whether the movement from GPn to GPm corresponds to a non-prioritized direction for which eNP is used (Step 2314). When the movement from GPn to GPm corresponds to the non-prioritized direction and when the term of eNP is included in the cost calculating formula (Step 2314, YES), the search unit 112 adds the cost value eNP to the cost M(m) (Step 2315).

Next, the search unit 112 calculates the cost f*(m) of GPm by use of the cost M(m), using Formula (2) to Formula (5) (Step 2316).

When the obtained identification information corresponds to a use-prohibited layer or a wiring-prohibited layer and when the term of aPL or gBL is included in the cost calculating formula (Step 2304, YES), the search unit 112 adds the cost value aPL or gBL to the cost M(m) (Step 2311).

When there does not exist any metal, in GPm, that is used as wiring (Step 2305, NO), the search unit 112 checks whether there exists a dummy metal in GPm (Step 2307). When there exists a dummy metal in GPm (Step 2307, YES), the search unit 112 checks whether there exists a dummy via in GPm (Step 2308).

When there exists a dummy via in GPm and when there exists the term of bDMV in the cost calculating formula (Step 2308, YES), the search unit 112 adds the cost value bDMV to the cost M(m) (Step 2309).

On the other hand, when there exists no dummy via in GPm and when the term of cDM is included in the cost calculating formula (Step 2308, NO), the search unit 112 adds the cost value cDM to the cost M(m) (Step 2310).

When there exists no corresponding wiring layer in GPm (Step 2302, NO), or when there exists no dummy metal in GPm (Step 2307, NO), the search unit 112 performs the processes of and after Step 2312.

When the movement from GPn to GPm does not correspond to the switching direction (Step 2312, NO), the search unit 112 performs the processes of and after Step 2314. When the movement from GPn to GPm does not correspond to the non-prioritized direction (Step 2314, NO), the search unit 112 performs the processes of and after Step 2316.

For example, when the cost files 320-1 to 320-5 of FIG. 17 are used, a wiring route for the ECO net "eco_net1" which satisfies the wiring-layer-number rule is generated on the basis of the cost calculating formula of the cost file 320-1. A wiring route for the ECO net "eco_net1" which satisfies the wiring-density rule is generated on the basis of the cost calculating formula of the cost file 320-2. A wiring route for the ECO net "eco_net1" which satisfies the timing rule is generated on the basis of the cost calculating formula of the cost file 320-3.

Further, a wiring route for the ECO net "eco_net1" which satisfies the wiring-layer-number rule is generated on the basis of the cost calculating formula of the cost file 320-4. A wiring route for the ECO net "eco_net1" which satisfies the timing rule is generated on the basis of the cost calculating formula of the cost file 320-5.

Next, an example of display processing in Step 412 of FIG. 4B is described with reference to FIGS. 24 to 34.

Figure 24:
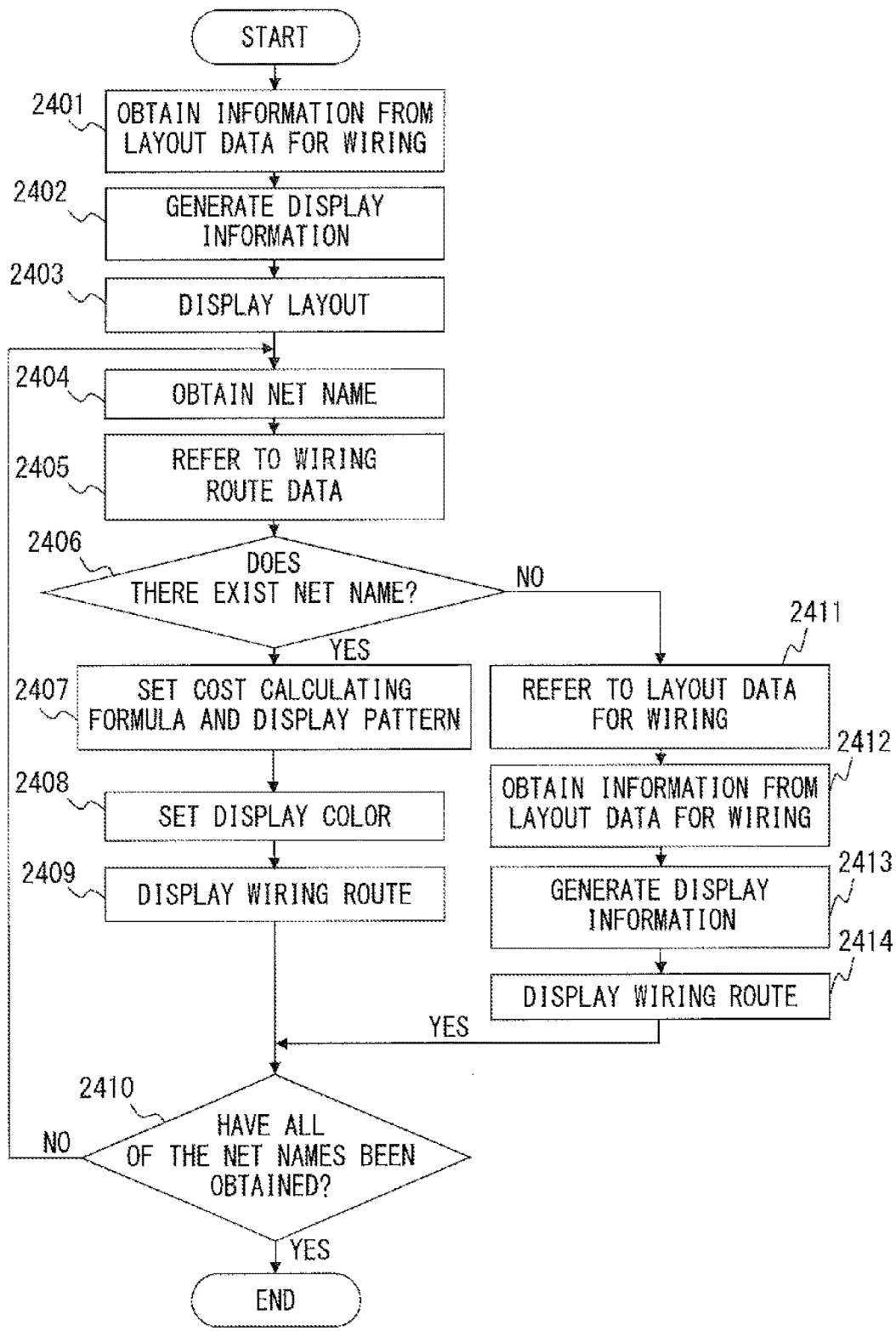
FIG. 24 is a flowchart of display processing.

FIG. 24 is a flowchart that illustrates an example of the display processing in Step 412 of FIG. 4B. First, the generator 113 obtains, from the layout data for wiring 316, information on, for example, the size of a semiconductor circuit, the coordinate of a logical element, a power wiring, and a dummy metal (Step 2401). Next, the generator 113 generates, on the basis of the obtained information, display information that displays a layout before change excluding a wiring of a net (Step 2402), so as to output the display information to the display unit 302 (Step 2403). Then, the display unit 302 displays the layout before change on the screen using the display information.

Next, the generator 113 obtains one net name from the net list for wiring 314 (Step 2404). Then, the generator 113 refers to the wiring route data 315 (Step 2405) so as to check whether the obtained net name is included in the wiring route data 315 (Step 2406).

When the obtained net name is included in the wiring route data 315 (Step 2406, YES), the generator 113 determines that the net name indicates a search target net. Then, the generator 113 sets a cost calculating formula and a display pattern for a wiring route of the search target net (Step 2407) and sets a display color (Step 2408), so as to generate display information that displays a wiring route (Step 2409). The display unit 302 displays wiring indicating the wiring route on the screen, using the display information.

On the other hand, when the obtained net name is not included in the wiring route data 315 (Step 2406, NO), the generator 113 determines that the net name indicates a net other than an ECO net. Then, the generator 113 refers to the layout data for wiring 316 (Step 2411) so as to obtain information on the wiring route of the net indicated by the net name (Step 2412).

The information on a wiring route includes pieces of identification information on a wiring layer and coordinates for all wiring segments that correspond to the net name. Each wiring segment corresponds to a portion of the wiring route and represents a line segment that connects two points included in a wiring area. The position and the length of a wiring segment can be represented by, for example, coordinates at both ends of the line segment.

Next, the generator 113 generates, on the basis of the obtained information on the wiring route, display information that displays a wiring route (Step 2413), so as to output the display information to the display unit 302 (Step 2414). Then, the display unit 302 displays wiring indicating a wiring route on the screen, using the display information.

After the process of Step 2409 or Step 2414 is performed, the generator 113 checks whether all of the net names have been obtained from the net list for wiring 314 (Step 2410). When an unobtained net name remains (Step 2410, NO), the generator 113 repeats the processes of and after Step 2404. When all of the net names have been obtained (Step 2410, YES), the generator 113 terminates the processing.

Figure 25:
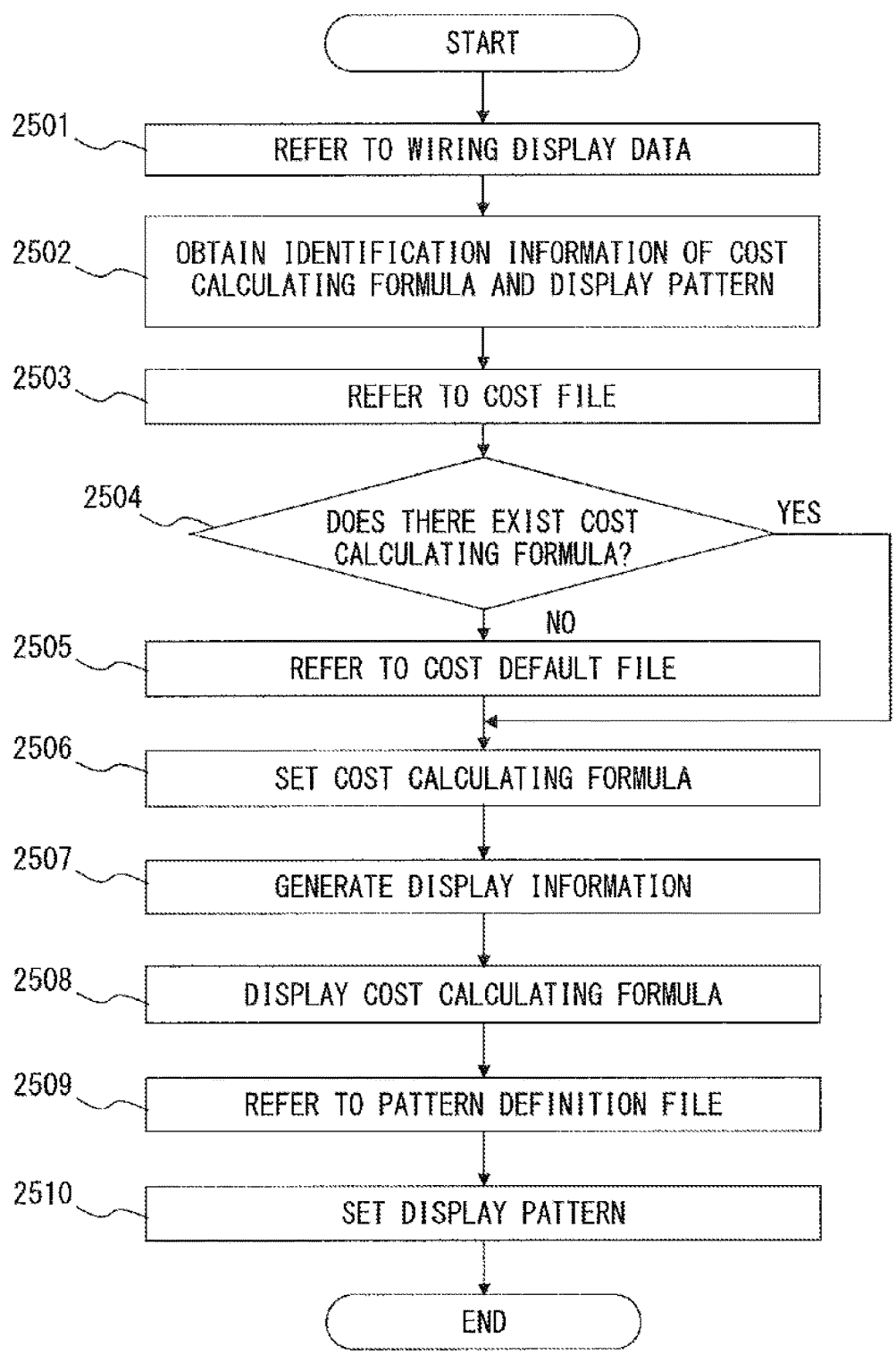
FIG. 25 is a flowchart of processing of setting a cost calculating formula and a display pattern.

FIG. 25 is a flowchart that illustrates an example of processing of setting a cost calculating formula and a display pattern in Step 2407 of FIG. 24. First, the generator 113 refers to the wiring display data 318 (Step 2501) so as to obtain identification information of a cost calculating formula and a display pattern that correspond to the net name (Step 2502).

Next, the generator 113 refers to a cost file 320-$i$ corresponding to the net name (Step 2503) so as to check whether the cost file 320-$i$ includes a cost calculating formula (Step 2504). For example, in the case of "eco_net1_cost1" of FIG. 11, the cost file 320-1 which corresponds to "cost1" is referred to from among the cost files 320-1 to 320-3 of FIG. 17 that correspond to "eco_net1".

When the cost file 320-$i$ does not include a cost calculating formula (Step 2504, NO), the cost default file 319 is referred to (Step 2505) so as to set a default cost calculating formula in attribute information on a wiring route (Step 2506). On the other hand, when the cost file 320-$i$ includes a cost calculating formula (Step 2504, YES), the cost calculating formula is set to the attribute information on the wiring route (Step 2506).

Next, the generator 113 generates display information that displays the attribute information (Step 2507), so as to output the display information to the display unit 302 (Step 2508). Then, the display unit 302 displays the cost calculating formula on the screen using the display information.

Next, the generator 113 refers to the pattern definition file 321 (Step 2509) so as to obtain a display pattern indicated by the identification information obtained in Step 2502, and sets the display pattern to the wiring route (Step 2510).

Figure 26:
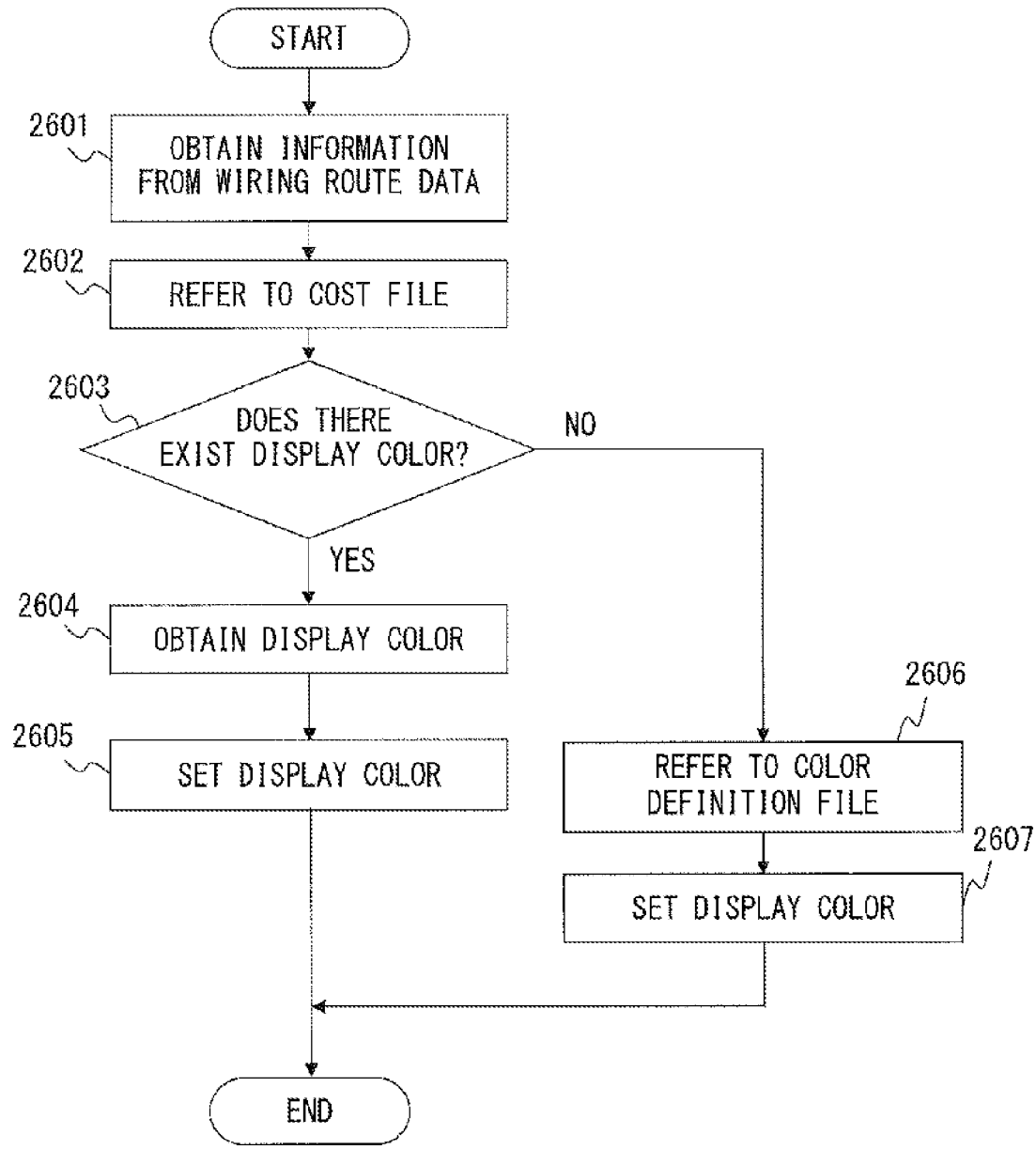
FIG. 26 is a flowchart of processing of setting a display color.

FIG. 26 is a flowchart that illustrates an example of processing of setting a display color in Step 2408 of FIG. 24. First, the generator 113 obtains information on a wiring route indicated by the net name from the wiring route data 315 (Step 2601). The information on a wiring route includes pieces of identification information on a wiring layer and coordinates for all wiring segments that correspond to the net name.

Next, the generator 113 refers to a cost file 320-$i$ that corresponds to the net name (Step 2602) so as to check whether the cost file 320-$i$ includes a display color (Step 2603).

When the cost file 320-$i$ includes a display color (Step 2603, YES), the generator 113 obtains the display color (Step 2604) and sets it to all of the wiring segments (Step 2605). In this case, one display color is set to all of the wiring segments included in the wiring route independently of a wiring layer of each of the wiring segments.

On the other hand, when the cost file 320-$i$ does not include a display color (Step 2603, NO), the generator 113 refers to the color definition file 322 (Step 2606). Then, the generator 113 obtains a display color that corresponds to a wiring layer of each of the wiring segments, and sets the display color to the wiring segment (Step 2607). In this case, a different display color for each wiring layer is set to a wiring segment.

Figure 27:
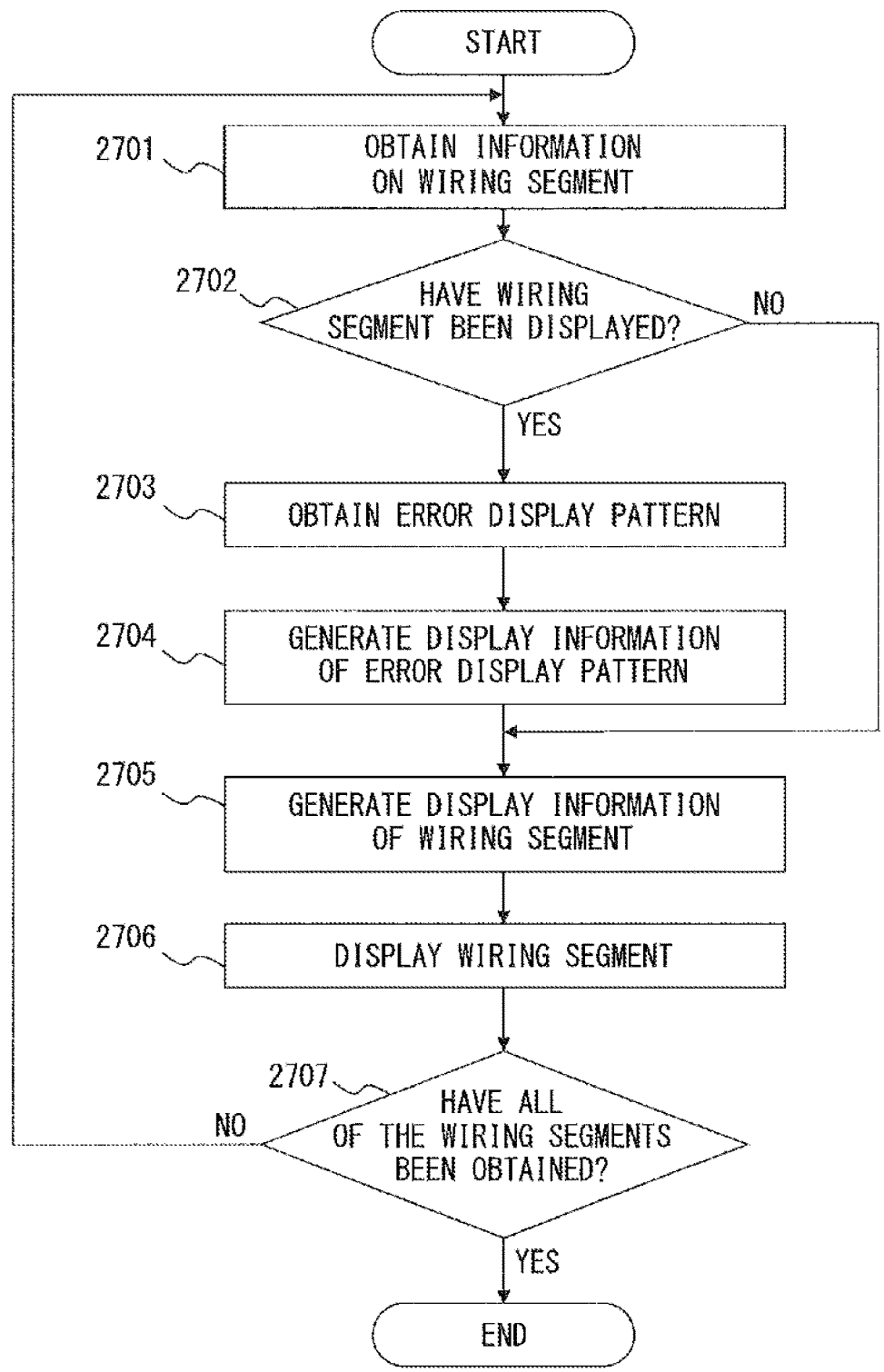
FIG. 27 is a flowchart of processing of displaying a wiring route.

FIG. 27 is a flowchart that illustrates an example of processing of displaying a wiring route in Step 2409 of FIG. 24. First, the generator 113 obtains, from the wiring route data 315, identification information of a wiring layer for one wiring segment included in a wiring route indicated by the net name and a coordinate for the wiring segment (Step 2701). Then, the generator 113 checks whether another wiring segment has already been displayed in the position of the wiring segment represented by the obtained coordinate in the wiring layer indicated by the obtained identification information (Step 2702).

When another wiring segment has been displayed (Step 2702, YES), the generator 113 determines that wiring has been short circuited. Then, the generator 113 obtains an error display pattern from the error definition file 323 (Step 2703), and generates display information that displays an error display pattern in a position in which two wiring segments overlap (Step 2704).

Next, the generator 113 generates display information that displays a wiring segment using the display pattern set in Step 2510 of FIG. 25 and the display color set in Step 2605 or Step 2606 of FIG. 26 (Step 2705).

Next, the generator 113 outputs, to the display unit 302, the display information that displays an error display pattern and the display information that displays a wiring segment (Step 2706). Then, the display unit 302 displays the error display pattern and the wiring segment on the screen using these pieces of display information.

On the other hand, when another wiring segment has not been displayed (Step 2702, NO), the generator 113 performs the processes of and after Step 2705. In this case, the display unit 302 only displays the wiring segment on the screen.

Next, the generator 113 checks whether pieces of information on all of the wiring segments included in the wiring route have been obtained from the wiring route data 315 (Step 2707). When an unobtained wiring segment remains (Step 2707, NO), the generator 113 repeats the processes of and after Step 2701. When the pieces of information on all of the wiring segments have been obtained (Step 2707, YES), the generator 113 terminates the processing.

Figure 28:
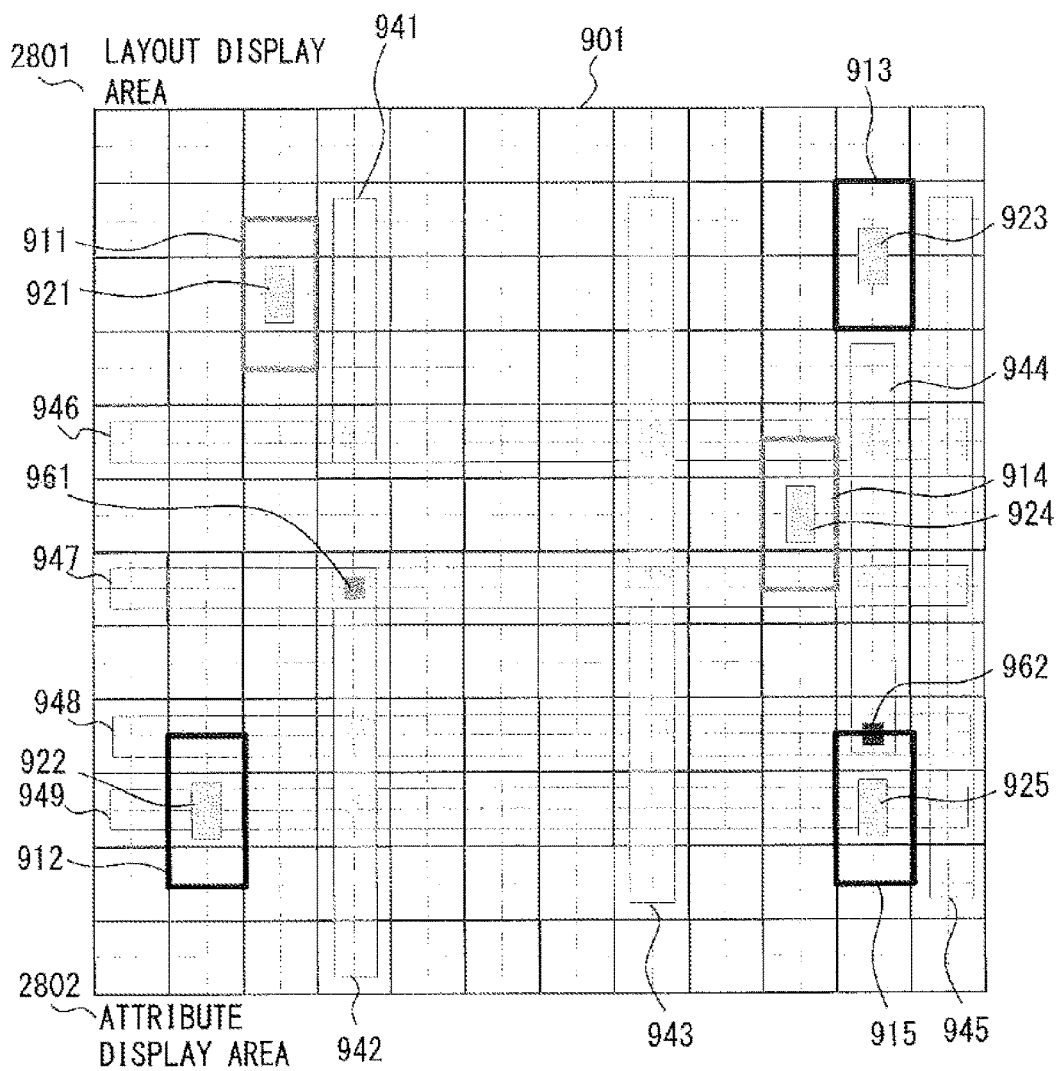
FIG. 28 illustrates a first display example.

FIG. 28 illustrates a first display example of displaying a layout before change in Step 2403 of FIG. 24. A layout display area 2801 for displaying a layout of a semiconductor circuit and an attribute display area 2802 for displaying attribute information on a wiring route are provided on the screen of the display unit 302. In the example of FIG. 28, from among the components of the semiconductor of FIG. 9, the components other than the metals 931 to 935 and the vias 951 to 953 are displayed in the layout display area 2801, and no information is displayed in the attribute display area 2802.

The driver pins 921 and 922, the receiver pins 923 to 925, and the dummy metals 941 to 945 are displayed in green in the layout display area 2801. The dummy metals 946 to 949 are provided in a use-prohibited layer and displayed in red. The dummy vias 961 and 962 are displayed in purple.

Figure 29:
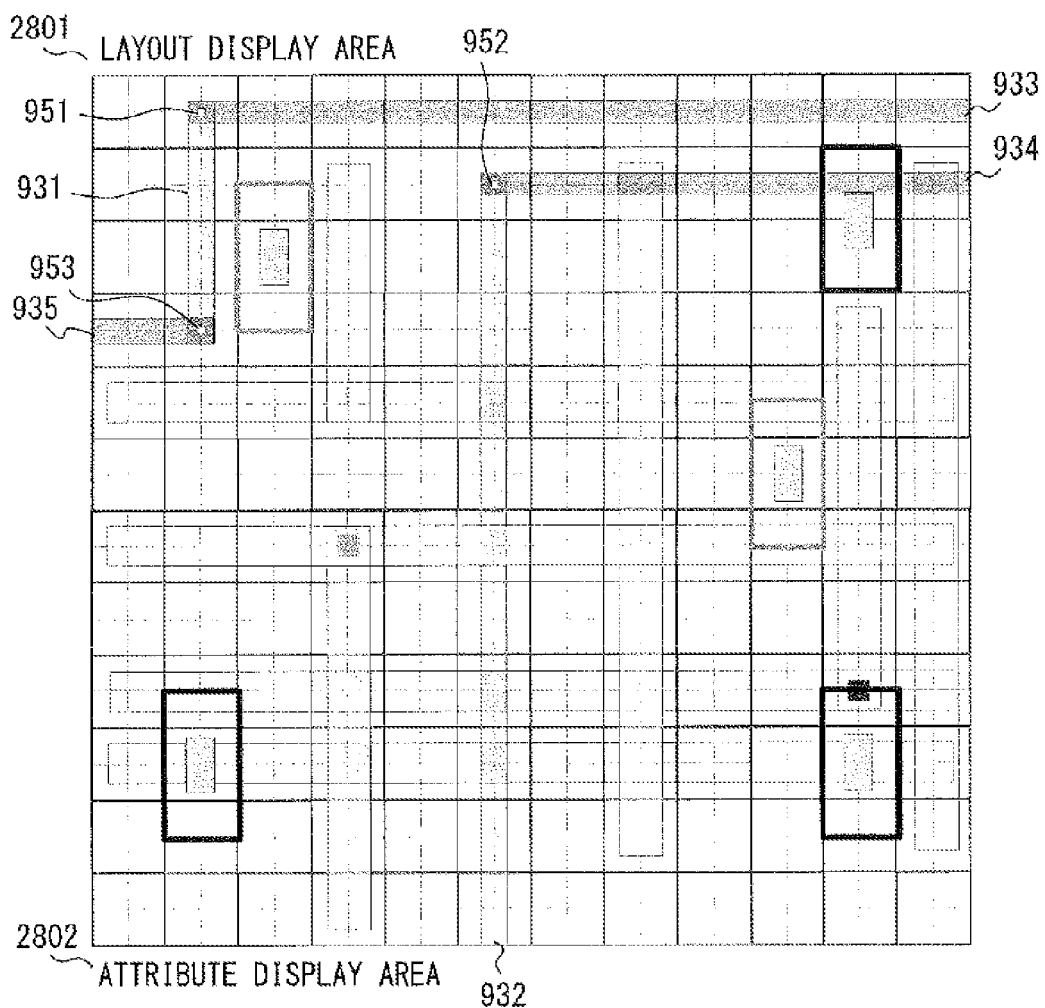
FIG. 29 illustrates a second display example.

FIG. 29 illustrates a second display example of displaying a wiring route of a net other than an ECO net in Step 2414 of FIG. 24. In the example of FIG. 29, the metals 931 to 935 and the vias 951 to 953 of FIG. 9 are added to the layout of FIG. 28. The metals 931 and 932 are displayed in green. The metals 933 to 935 are provided in a use-prohibited layer and displayed in red. The vias 951 to 953 are displayed in yellow.

Figure 30:
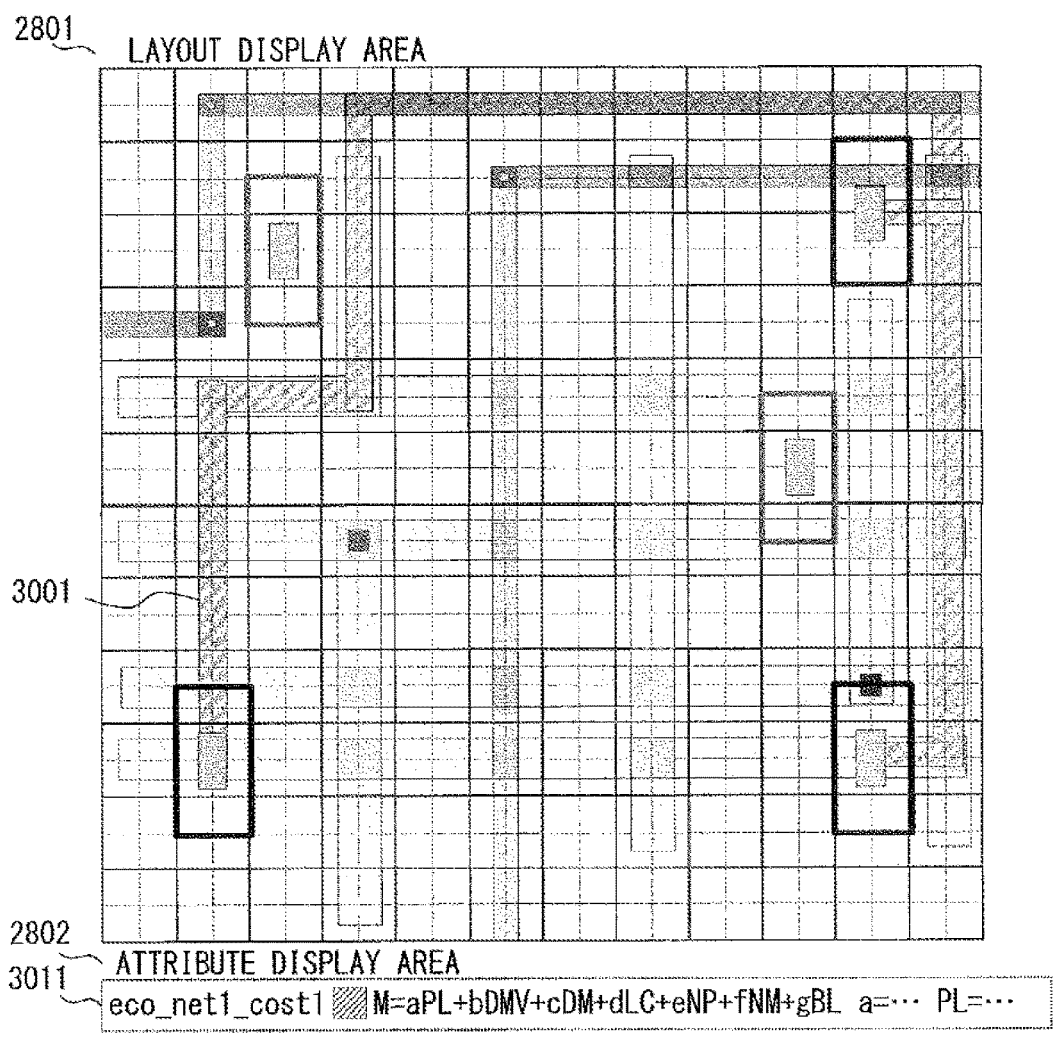
FIG. 30 illustrates a third display example.

FIG. 30 illustrates a third display example of displaying a wiring route of an ECO net in Step 2409 of FIG. 24. In the example of FIG. 30, a wiring route 3001 that corresponds to "eco_net1_cost1" of FIG. 11 is added to the layout of FIG. 29 and displayed using the display pattern "pattern1" of FIG. 13. All of the wiring segments included in the wiring route 3001 exist in one wiring layer, so the entirety of the wiring route 3001 is displayed in green.

Further, in the attribute display area 2802, a net name, a display pattern, a cost calculating formula, a coefficient, and a variable are displayed as attribute information 3011 of the wiring route 3001.

Figure 31:
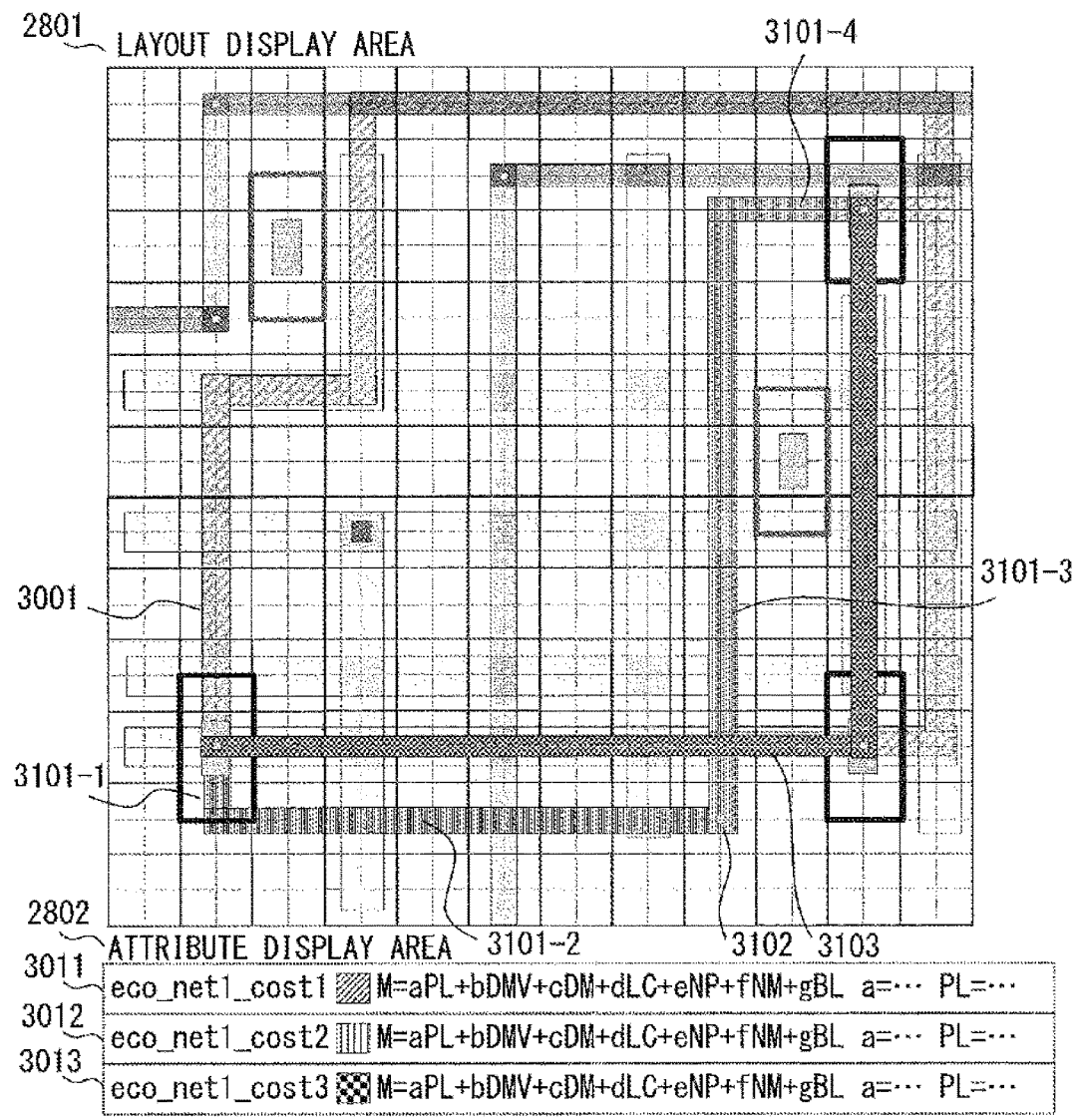
FIG. 31 illustrates a fourth display example.

FIG. 31 illustrates a fourth display example in which wiring routes are further added to the layout of FIG. 30. In the example of FIG. 31, a wiring route 3002 that corresponds to "eco_net1_cost2" and a wiring route 3003 that corresponds to "eco_net1_cost3" are added.

The wiring route 3002 includes metals 3101-1 to 3101-4 that each correspond to a wiring segment and is displayed using the display pattern "pattern2". The metal 3101-1, the metal 3101-3, and the metal 3101-4 exist in one wiring layer and are displayed in green. On the other hand, the metal 3101-2 exists in another wiring layer and is displayed in red.

The wiring route 3003 is displayed using the display pattern "pattern3". All of the wiring segments included in the wiring route 3003 exist in one wiring layer, so the entirety of the wiring route 3003 is displayed in red.

Further, attribute information 3012 of the wiring route 3002 and attribute information 3013 of the wiring route 3003 are added to the attribute display area 2802.

Figure 32:
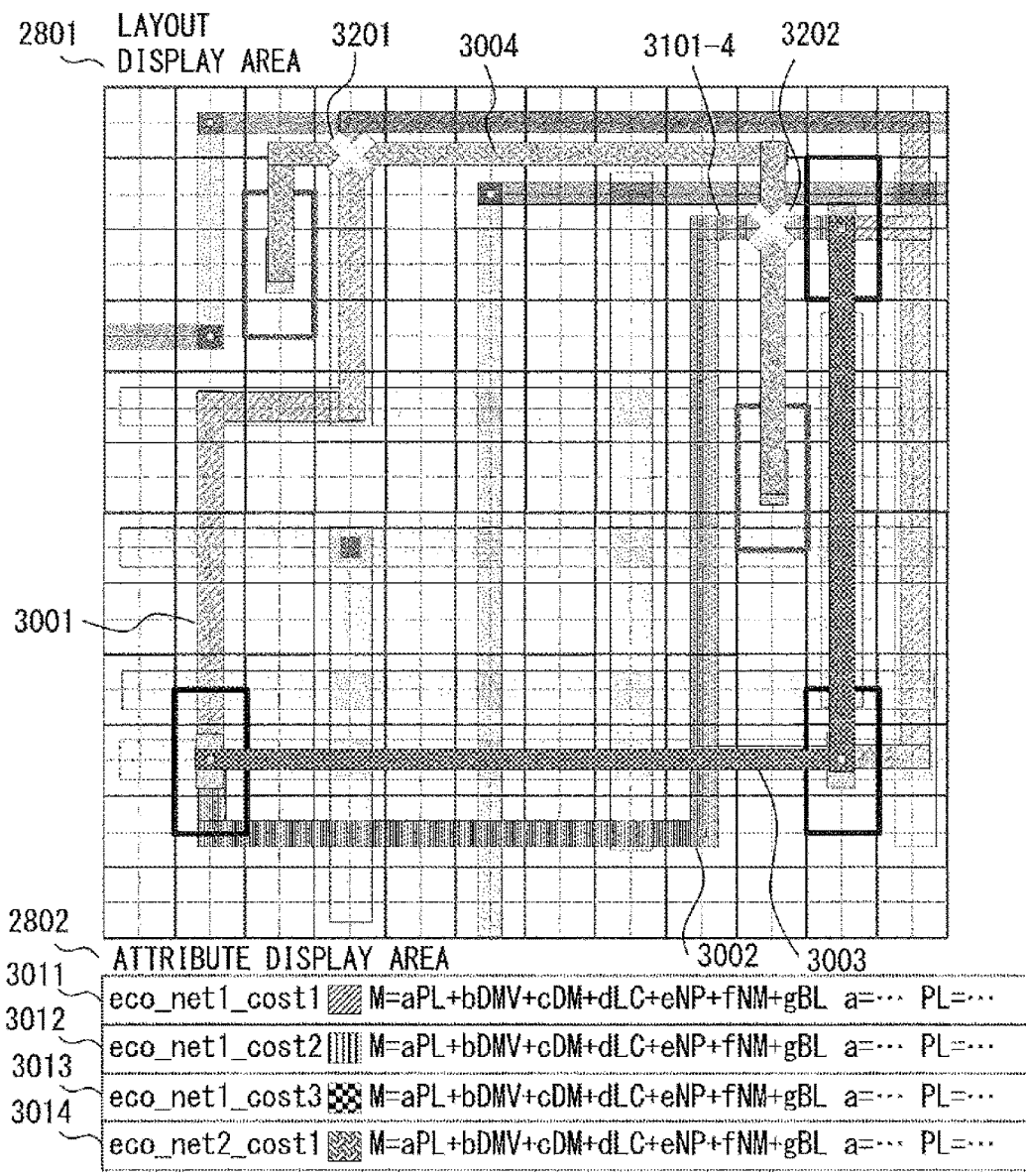
FIG. 32 illustrates a fifth display example.

FIG. 32 illustrates a fifth display example in which a wiring route is further added to the layout of FIG. 31. In the example of FIG. 32, a wiring route 3004 that corresponds to "eco_net2_cost1" is added and displayed using the display pattern "pattern8". All of the wiring segments included in the wiring route 3004 exist in one wiring layer, so the entirety of the wiring route 3004 is displayed in green.

In this case, the wiring route 3001 and the wiring route 3004 exist in one wiring layer, so an error display pattern 3201 is displayed in a position in which these wiring routes overlap. Likewise, an error display pattern 3202 is displayed in a position in which the metal 3101-4 of the wiring route 3002 and the wiring route 3004 overlap. Attribute information 3014 of the wiring route 3004 is added to the attribute display area 2802.

Figure 33:
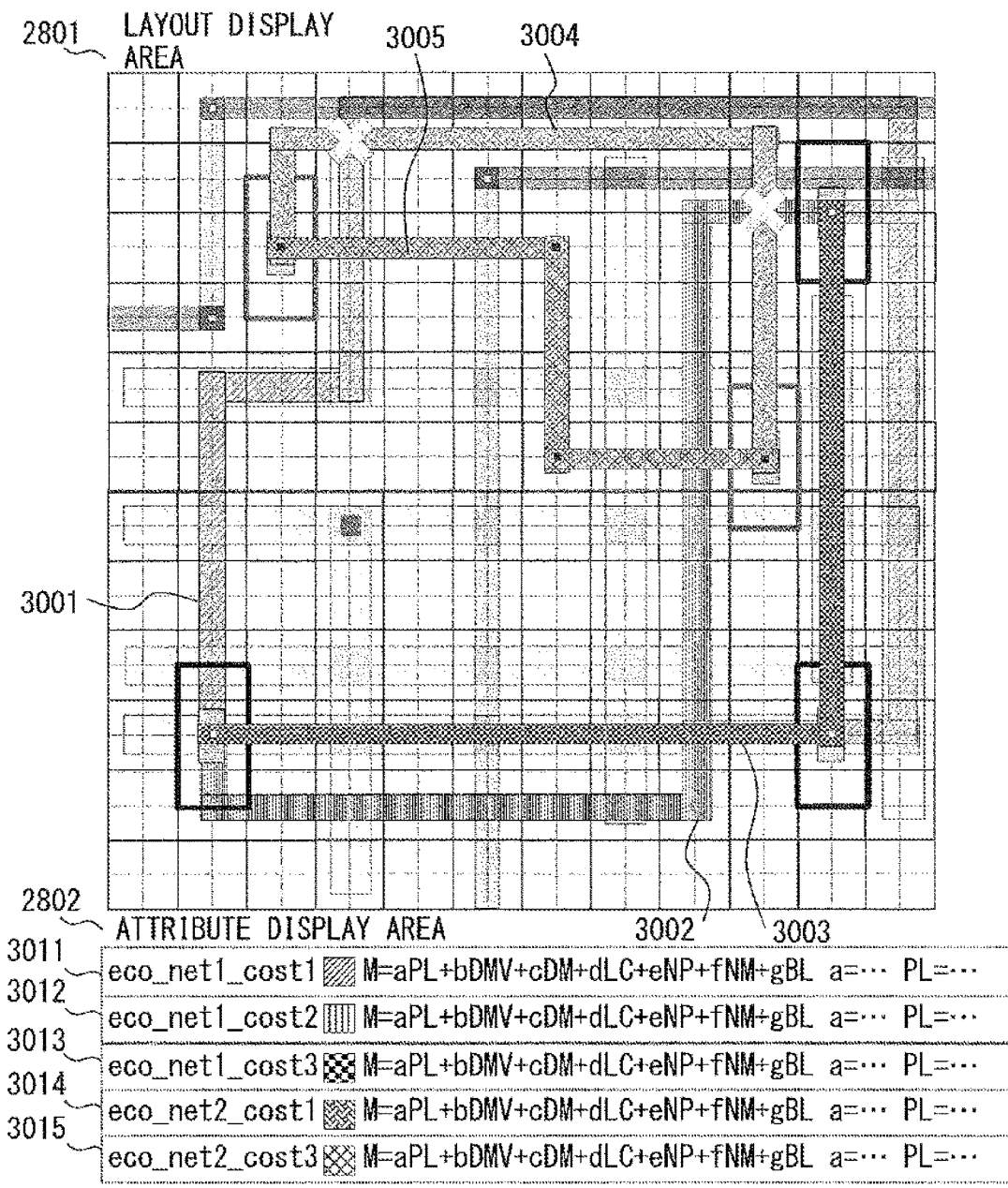
FIG. 33 illustrates a sixth display example.

FIG. 33 illustrates a sixth display example in which a wiring route is further added to the layout of FIG. 32. In the example of FIG. 33, a wiring route 3005 that corresponds to "eco_net2_cost3" is added and displayed using the display pattern "pattern9". A display color is set to "red" in the cost file 320-5 of FIG. 17 which corresponds to "eco_net2_cost3", so the entirety of the wiring route 3005 is displayed in red. Further, attribute information 3015 of the wiring route 3005 is added to the attribute display area 2802.

As described above, if a wiring route based on a different cost calculating formula with respect to each ECO is displayed using a different display pattern and the cost calculating formula corresponding to the wiring route is displayed together, it is possible to easily recognize a correspondence relationship between a wiring route and a cost calculating formula. Further, the use of a different display color for each wiring layer permits a recognition of a correspondence relationship between a wiring route and a wiring layer, and the display of an error display pattern permits a recognition of a location where wiring has been short circuited.

In Step 413 of FIG. 4B, the user selects an optimal wiring route for the ECO net "eco_net1" from among the wiring routes 3001 to 3003 while viewing the screen of FIG. 33, and inputs a selection instruction. Likewise, the user selects an optimal wiring route for the ECO net "eco_net1" from among the wiring routes 3004 and 3005, and inputs a selection instruction.

Figure 34:
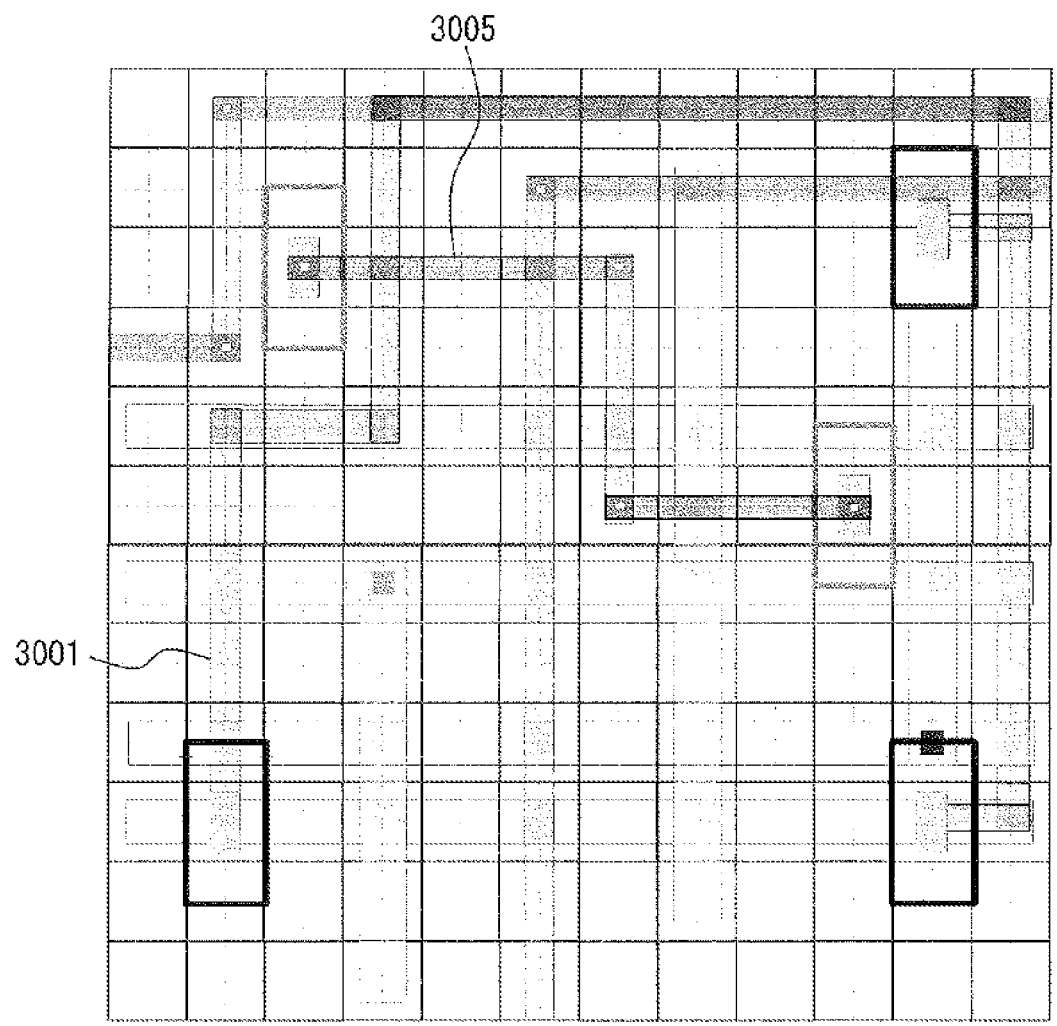
FIG. 34 illustrates a determined wiring route.

FIG. 34 illustrates an example of a wiring route determined according to a selection instruction of a user. In this example, the wiring route 3001 is selected for "eco_net1" and the wiring route 3005 is selected for "eco_net1". The wiring route 3001 is a wiring route that satisfies the wiring-layer-number rule, and the wiring route 3005 is a wiring route that satisfies the timing rule.

After wiring routes for all of the ECO nets are determined in Step 413, the user can also change some of the determined wiring routes to different wiring route(s) by implementing a wiring repair. In this case, the user changes the cost calculating formula of a cost file **320-*i* corresponding to a change target ECO net or adds a new cost file 320-*i*, so as to cause the semiconductor design assisting device 101 to perform the processes of and after Step 407 to Step 414** again.

The configurations of the semiconductor design assisting device 101 of FIGS. 1 and 3 are merely examples, and some of the components may be omitted or changed according to the applications or the requirements of the semiconductor design assisting device 101. For example, when the semiconductor design assisting device 101 receives a processing request from a user terminal so as to perform design changing processing, and transmits generated display information to the user terminal, the display unit 302 of FIG. 3 can be omitted.

When a display pattern is not changed for each wiring route, the pattern definition file 321 can be omitted, and when a display color of a wiring route is not changed for each wiring layer, the color definition file 322 can be omitted. When an error display pattern is not displayed on the screen, the error definition file 323 can be omitted.

The flowcharts of FIGS. 2, 4A and 4B, and 20 to 27 are merely examples, and some of the processes may be omitted or changed according to the configurations or the requirements of the semiconductor design assisting device 101. For example, when the net list for wiring 314 and the layout data for wiring 316 are generated by a device external to the semiconductor design assisting device 101 in the design changing processing of FIGS. 4A and 4B, the processes of Step 401 to Step 406 can be omitted. The design change in a semiconductor integrated circuit is not limited to an addition of a new net, but it may be a logic change along with a deletion of or modification to a net or may be a modification to a timing of a signal.

In the processing of searching for a wiring route of FIGS. 20 to 23, the search unit 112 may set a receiver pin and a driver pin to be a start point GP and an end point GP, respectively, instead of setting the driver pin and the receiver pin to be the start point GP and the endpoint GP, respectively, so as to search for a wiring route. Another route search algorithm based on a cost calculating formula may be used instead of an A* search algorithm.

In the cost calculation processing of FIG. 23, when aPL and gBL are not included in the cost calculating formula, the processes of Step 2304 and Step 2311 can be omitted. When fNM is not included in the cost calculating formula, the processes of Step 2305 and Step 2306 can be omitted.

When bDMV is not included in the cost calculating formula, the processes of Step 2308 and Step 2309 can be omitted. When cDM is not included in the cost calculating formula, the processes of Step 2308 and Step 2310 can be omitted. When bDMV and cDM are not included in the cost calculating formula, the processes of Step 2307 to Step 2310 can be omitted.

When dLC is not included in the cost calculating formula, the processes of Step 2312 and Step 2313 can be omitted. When eNP is not included in the cost calculating formula, the processes of Step 2314 and Step 2315 can be omitted.

In the processing of setting a cost calculating formula and a display pattern of FIG. 25, when a cost calculating formula is not displayed on the screen, the processes of Step 2503 to Step 2508 can be omitted. When a display pattern is not changed for each wiring route, the processes of Step 2509 and Step 2510 can be omitted.

When a display color of a wiring route is not changed for each wiring layer, the processing of setting a display color of FIG. 26 can be omitted. In the processing of displaying a wiring route of FIG. 27, when an error display pattern is not displayed on the screen, the processes of Step 2702 to Step 2704 can be omitted.

The semiconductor circuit and the wiring routes of FIGS. 5 to 7 are merely examples, and other semiconductor circuit and wiring routes may be used. The wiring area of FIG. 8 is merely an example, and another wiring area may be used. The semiconductor circuit of FIG. 9 and the layouts of FIGS. 28 to 34 are merely examples, and other semiconductor circuit and layouts may be used.

The pieces of information such as a net list, layout data, and a file of FIGS. 10 to 19 are merely examples, and other pieces of information may be used. For example, all of the coefficients in each term may be set to one in each of the cost calculating formulas of FIGS. 15, 16A, 16B, and 17. In this case, a cost calculating formula is defined using only a variable.

Figure 35:
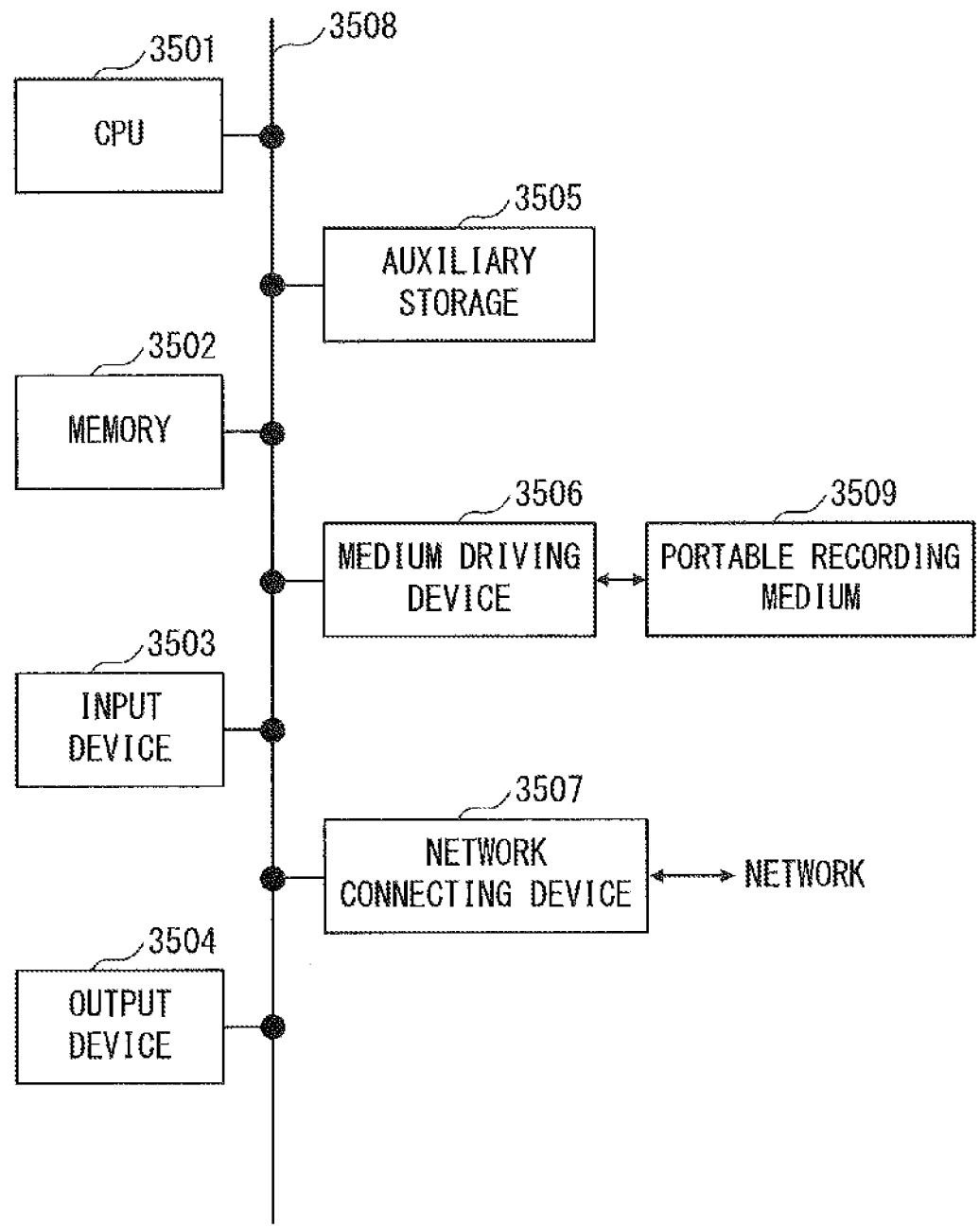
FIG. 35 illustrates a configuration of an information processing device.

The semiconductor design assisting device 101 of FIGS. and 3 can be realized by, for example, an information processing device (a computer) illustrated in FIG. 35. The information processing device of FIG. 35 includes a central processing unit (CPU) 3501, a memory 3502, an input device 3503, an output device 3504, an auxiliary storage 3505, a medium driving device 3506, and a network connecting device 3507. These components are connected to one another via a bus 3508.

The memory 3502 is, for example, a semiconductor memory such as a read only memory (ROM), a random access memory (RAM), and a flash memory, and stores therein a program and data used for performing the design changing processing. The memory 3502 can be used as the storage 111 of FIGS. 1 and 3.

For example, the CPU 3501 (processor) operates as the search unit 112, the generator 113, and the controller 301 of FIGS. 1 and 3 by executing the program by use of the memory 3502.

The input device 3503 is, for example, a keyboard or a pointing device, and is used for inputting instructions or information from a user. The output device 3504 is, for example, a display, a printer, or a speaker, and is used for outputting inquiries to the user or a result of processing. The result of processing may be a wiring route obtained by a search. The output device 3504 can be used as the display unit 302 of FIG. 3.

The auxiliary storage 3505 is, for example, a magnetic disk device, an optical disk device, a magneto-optical disk device, or a tape device. The auxiliary storage 3505 may be a hard disk drive or a flash memory. The information processing device stores the program and the data in the auxiliary storage 3505 so as to load them into the memory 3502 and use them. The auxiliary storage 3505 can be used as the storage 111 of FIGS. 1 and 3.

The medium driving device 3506 drives a portable recording medium 3509 so as to access the recorded content. The portable recording medium 3509 is, for example, a memory device, a flexible disk, an optical disc, or a magneto-optical disk. The portable recording medium 3509 may be, for example, a compact disk read only memory (CD-ROM), a digital versatile disk (DVD), or a universal serial bus (USB) memory. The user stores the program and the data in the portable recording medium 3509 so as to load them into the memory 3502 and use them.

As described above, a computer-readable recording medium that stores therein a program and data used for the design changing processing is a physical (non-transitory) recording medium such as the memory 3502, the auxiliary storage 3505, and the portable recording medium 3509.

The network connecting device 3507 is a communication interface that is connected to a communication network such as a local area network or a wide area network and makes a data conversion associated with communication. The information processing device receives the program and the data from an external device via the network connecting device 3507 so as to load them into the memory 3502 and use them. The information processing device can also receive a processing request from a user terminal, perform a design change, and transmit generated display information to the user terminal via the network connecting device 3507.

The information processing device does not necessarily include all of the components in FIG. 35, and some of the components can be omitted according to the applications or the requirements. For example, when the information processing device receives a processing request from the user terminal via the communication network, the input device 3503 and the output device 3504 may be omitted. When there is no need for a communication with other devices, the network connecting device 3507 may be omitted. When the portable recording medium 3509 is not used, the medium driving device 3506 may be omitted.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor design assisting device comprising:
a memory that stores layout data of a semiconductor circuit and an open list holding an unvisited grid point and a parent pointer that indicates a parent grid point of the unvisited grid point, the layout data representing the semiconductor circuit after manufacturing; and
a processor that searches, upon performing a design change on the layout data, for a plurality of wiring routes based on a plurality of cost calculating formulas that respectively represent a plurality of design rules and based on the layout data, and that generates display information for displaying the plurality of wiring routes,
the plurality of wiring routes are a plurality of candidates for a wiring route that corresponds to a processing target net that is connection information that needs to be changed in the semiconductor circuit and respectively satisfy the plurality of design rules, and
the processor performs a searching process by using each of the plurality of cost calculating formulas, the searching process including:
setting a start grid point of the processing target net in the open list and a NULL for a parent pointer of the start grid point;
setting the start grid point to a development source grid point that is developed in a plurality of directions;
developing the start grid point in the plurality of directions so as to obtain a plurality of adjacent grid points;
extracting the start grid point from the open list;
searching for an end grid point of the processing target net while repeatedly calculating a cost of a shortest route to reach the end grid point from the start grid point through each of the plurality of adjacent grid points by using a cost calculating formula, adding each of the plurality of adjacent grid points to the open list, setting one of the plurality of adjacent grid points in the open list to the development source grid point based on the cost of the shortest route, developing the development source grid point in the plurality of directions so as to obtain a plurality of adjacent grid points, extracting an adjacent grid point set to be the development source grid point from the open list and checking whether the development source grid point matches the end grid point;
checking a parent pointer of the development source grid point when the development source grid point matches the end grid point;
setting a parent grid point indicated by the parent pointer of the development source grid point to the development source grid point and repeating checking a parent pointer of the development source grid point when a NULL is not set for the parent pointer of the development source grid point;
determining that the development source grid point matches the start grid point when a NULL is set for the parent pointer of the development source grid point; and
determining, to be a wiring route from the start grid point to the end grid point, a route that connects each grid point which has been visited until the start grid point is reached from the end grid point.

2. The semiconductor design assisting device according to claim 1, wherein the processor searches for a plurality of sets of wiring routes for each of a plurality of processing target nets that include the processing target net, such that a search result for a certain processing target net is not dependent on a search result for another processing target net among the plurality of processing target nets, and the display information displays the plurality of wiring routes included in each of the plurality of sets for each of the plurality of processing target nets.

3. The semiconductor design assisting device according to claim 1, wherein the plurality of design rules include at least two of a first design rule that specifies a number of wiring layers to be changed according to the design change from among a plurality of wiring layers included in the semiconductor circuit, a second design rule that specifies a wiring density in the semiconductor circuit, or a third design rule that specifies a timing of a signal in the semiconductor circuit.

4. The semiconductor design assisting device according to claim 1, wherein each of the plurality of cost calculating formulas represents a cost value that indicates a use-prohibited layer in which a design change is prohibited, a cost value that indicates a wiring-prohibited layer in which wiring is prohibited, a cost value indicating that there exists a dummy metal, a cost value indicating that there exists a metal used as wiring, a cost value that indicates a change in a wiring layer, or a cost value indicating that a wiring direction is different from a prioritized direction or a sum of any combination thereof, wherein the use-prohibited layer is included in a plurality of wiring layers included in the semiconductor circuit and the wiring-prohibited layer is a wiring layer other than the use-prohibited layer.

5. A semiconductor design assisting method executed by a processor, the method comprising:
searching by a processor, upon performing a design change on layout data representing a semiconductor circuit after manufacturing, for a plurality of wiring routes based on a plurality of cost calculating formulas that respectively represent a plurality of design rules, and based on the layout data, the layout data and an open list holding an unvisited grid point and a parent pointer that indicates a parent grid point of the unvisited grid point being stored in a memory, the plurality of wiring routes are a plurality of candidates for a wiring route that corresponds to a processing target net that is connection information that needs to be changed in the semiconductor circuit, and respectively satisfy the plurality of design rules;
selecting by the processor, one of a plurality of display patterns for each of the plurality of wiring routes from a pattern definition file including the plurality of display patterns, the pattern definition file is stored in the memory, the plurality of display patterns respectively correspond to the plurality of cost calculating formulas, and selected display patterns for the plurality of wiring routes differ from each other; and generating by the processor, display information for displaying the plurality of wiring routes, performing by the processor, a searching process for each of the plurality of wiring routes by using each of the plurality of cost calculating formulas, the searching process including:

setting a start grid point of the processing target net in the open list and a NULL for a parent pointer of the start grid point;

setting the start grid point to a development source grid point that is developed in a plurality of directions;

developing the start grid point in the plurality of directions so as to obtain a plurality of adjacent grid points;

extracting the start grid point from the open list;

searching for an end grid point of the processing target net while repeatedly calculating a cost of a shortest route to reach the end grid point from the start grid point through each of the plurality of adjacent grid points by using a cost calculating formula, adding each of the plurality of adjacent grid points to the open list, setting one of the plurality of adjacent grid points in the open list to the development source grid point based on the cost of the shortest route, developing the development source grid point in the plurality of directions so as to obtain a plurality of adjacent grid points, extracting an adjacent grid point set to be the development source grid point from the open list and checking whether the development source grid point matches the end grid point;

checking a parent pointer of the development source grid point when the development source grid point matches the end grid point;

setting a parent grid point indicated by the parent pointer of the development source grid point to the development source grid point and repeating checking a parent pointer of the development source grid point when a NULL is not set for the parent pointer of the development source grid point;

determining that the development source grid point matches the start grid point when a NULL is set for the parent pointer of the development source grid point; and determining, to be a wiring route from the start grid point to the end grid point, a route that connects each grid point which has been visited until the start grid point is reached from the end grid point.

6. The semiconductor design assisting method according to claim 5, wherein the searching for the plurality of wiring routes searches for a plurality of sets of wiring routes for each of a plurality of processing target nets that include the processing target net, such that a search result for a certain processing target net is not dependent on a search result for another processing target net among the plurality of processing target nets, and the display information displays the plurality of wiring routes included in each of the plurality of sets for each of the plurality of processing target nets.

7. The semiconductor design assisting method according to claim 5, wherein the plurality of design rules include at least two of a first design rule that specifies a number of wiring layers to be changed according to the design change from among a plurality of wiring layers included in the semiconductor circuit, a second design rule that specifies a wiring density in the semiconductor circuit, or a third design rule that specifies a timing of a signal in the semiconductor circuit.

8. The semiconductor design assisting method according to claim 5, wherein each of the plurality of cost calculating formulas represents a cost value that indicates a use-prohibited layer in which a design change is prohibited, a cost value that indicates a wiring-prohibited layer in which wiring is prohibited, a cost value indicating that there exists a dummy metal, a cost value indicating that there exists a metal used as wiring, a cost value that indicates a change in a wiring layer, or a cost value indicating that a wiring direction is different from a prioritized direction or a sum of any combination thereof, wherein the use-prohibited layer is included in a plurality of wiring layers included in the semiconductor circuit and the wiring-prohibited layer is a wiring layer other than the use-prohibited layer.

9. A non-transitory computer-readable recording medium having stored therein a semiconductor design assisting program causing a computer to execute a process comprising:

searching, upon performing a design change on layout data representing a semiconductor circuit after manufacturing, for a plurality of wiring routes based on a plurality of cost calculating formulas that respectively represent a plurality of design rules, and based on the layout data, the layout data and an open list holding an unvisited grid point and a parent pointer that indicates a parent grid point of the unvisited grid point being stored in a memory, the plurality of wiring routes are a plurality of candidates for a wiring route that corresponds to a processing target net that is connection information that needs to be changed in the semiconductor circuit, and respectively satisfy the plurality of design rules;

selecting one of a plurality of display patterns for each of the plurality of wiring routes from a pattern definition file including the plurality of display patterns, the pattern definition file is stored in the memory, the plurality of display patterns respectively correspond to the plurality of cost calculating formulas, and selected display patterns for the plurality of wiring routes differ from each other; and generating display information for displaying the plurality of wiring routes, performing a searching process for each of the plurality of wiring routes by using each of the plurality of cost calculating formulas, the searching process including:

setting a start grid point of the processing target net in the open list and a NULL for a parent pointer of the start grid point;

setting the start grid point to a development source grid point that is developed in a plurality of directions;

developing the start grid point in the plurality of directions so as to obtain a plurality of adjacent grid points;

extracting the start grid point from the open list;

searching for an end grid point of the processing target net while repeatedly calculating a cost of a shortest route to reach the end grid point from the start grid point through each of the plurality of adjacent grid points by using a cost calculating formula, adding each of the plurality of adjacent grid points to the open list, setting one of the plurality of adjacent grid points in the open list to the development source grid point based on the cost of the shortest route, developing the development source grid point in the plurality of directions so as to obtain a plurality of adjacent grid points, extracting an adjacent grid point set to be the development source grid point from the open list and checking whether the development source grid point matches the end grid point;

checking a parent pointer of the development source grid point when the development source grid point matches the end grid point;

setting a parent grid point indicated by the parent pointer of the development source grid point to the development source grid point and repeating checking a parent pointer of the development source grid point when a NULL is not set for the parent pointer of the development source grid point;

determining that the development source grid point matches the start grid point when a NULL is set for the parent pointer of the development source grid point; and determining, to be a wiring route from the start grid point to the end grid point, a route that connects each grid point which has been visited until the start grid point is reached from the end grid point.

10. The non-transitory computer-readable recording medium according to claim 9, wherein the searching for the plurality of wiring routes searches for a plurality of sets of wiring routes for each of a plurality of processing target nets that include the processing target net, such that a search result for a certain processing target net is not dependent on a search result for another processing target net among the plurality of processing target nets, and the display information displays the plurality of wiring routes included in each of the plurality of sets for each of the plurality of processing target nets.

11. The non-transitory computer-readable recording medium according to claim 9, wherein the plurality of design rules include at least two of a first design rule that specifies a number of wiring layers to be changed according to the design change from among a plurality of wiring layers included in the semiconductor circuit, a second design rule that specifies a wiring density in the semiconductor circuit, or a third design rule that specifies a timing of a signal in the semiconductor circuit.

12. The non-transitory computer-readable recording medium according to claim 9, wherein each of the plurality of cost calculating formulas represents a cost value that indicates a use-prohibited layer in which a design change is prohibited, a cost value that indicates a wiring-prohibited layer in which wiring is prohibited, a cost value indicating that there exists a dummy metal, a cost value indicating that there exists a metal used as wiring, a cost value that indicates a change in a wiring layer, or a cost value indicating that a wiring direction is different from a prioritized direction or a sum of any combination thereof, wherein the use-prohibited layer is included in the plurality of wiring layers included in the semiconductor circuit and the wiring-prohibited layer is a wiring layer other than the use-prohibited layer.

* * * * *